(12) United States Patent
Ben-Bassat et al.

(10) Patent No.: US 12,368,519 B2
(45) Date of Patent: Jul. 22, 2025

(54) ELECTRONIC CIRCUITRY, SYSTEM, BASE STATION, MOBILE DEVICE AND METHOD

(71) Applicant: Intel Corporation, Santa Clara, CA (US)

(72) Inventors: Assaf Ben-Bassat, Haifa (IL); Eli Borokhovich, Modiin-Maccabim-Reu (IL); Phillip Skliar, Holon (IL)

(73) Assignee: Intel corporation, Santa Clara, CA (US)

( * ) Notice: Subject to any disclaimer, the term of this patent is extended or adjusted under 35 U.S.C. 154(b) by 22 days.

(21) Appl. No.: 18/458,063

(22) Filed: Aug. 29, 2023

(65) Prior Publication Data

US 2024/0121015 A1    Apr. 11, 2024

(30) Foreign Application Priority Data

Sep. 29, 2022 (EP) .................................... 22198582

(51) Int. Cl.
| | |
|---|---|
| *H04B 3/06* | (2006.01) |
| *G01R 21/133* | (2006.01) |
| *G01R 25/00* | (2006.01) |
| *H04B 17/10* | (2015.01) |
| *H04B 17/14* | (2015.01) |
| *H04L 25/02* | (2006.01) |

(52) U.S. Cl.
CPC ......... *H04B 17/103* (2015.01); *G01R 21/133* (2013.01); *G01R 25/00* (2013.01); *H04B 3/06* (2013.01); *H04B 17/14* (2015.01); *H04L 25/028* (2013.01)

(58) Field of Classification Search
CPC ........ H04B 17/103; H04B 17/14; H04B 3/06; H04L 25/028; G01R 21/133; G01R 25/00
See application file for complete search history.

(56) References Cited

U.S. PATENT DOCUMENTS

| | | | |
|---|---|---|---|
| 2014/0313088 A1* | 10/2014 | Rozenblit | ................ H03H 7/40 343/745 |
| 2020/0099457 A1* | 3/2020 | Lübbers | .................... H03F 1/32 |
| 2022/0149879 A1 | 5/2022 | Iversen et al. | |

FOREIGN PATENT DOCUMENTS

| | | |
|---|---|---|
| EP | 3057229 B1 | 8/2016 |
| TW | 201419763 A | 5/2014 |

* cited by examiner

*Primary Examiner* — Rahel Guarino
(74) *Attorney, Agent, or Firm* — 2SPL Patent Attorneys PartG mbB; Kieran O'Leary

(57) ABSTRACT

An electronic circuitry is proposed. The electronic circuitry comprises a directional coupler comprising a first port configured to receive an input signal from a signal source, a second port configured to output the input signal for transmission to a load, a third port configured to output a forward signal based on the input signal, and a fourth port configured to output a reverse signal based on a reflection of the input signal received at the second port. The electronic circuitry further comprises a Time-to-Digital converter, TDC, coupled to the third port and the fourth port. The TDC is configured to determine a phase difference between the forward signal and the reverse signal.

17 Claims, 18 Drawing Sheets

ELECTRONIC CIRCUITRY, SYSTEM, BASE STATION, MOBILE DEVICE AND METHOD

CROSS-REFERENCE TO RELATED APPLICATION

This application claims priority to European Application 22198582.3, filed on Sep. 29, 2022. The content of this earlier filed application is incorporated by reference herein in its entirety.

BACKGROUND

An impedance transition between a transmission line and a load may cause a signal conducted in the transmission line to be reflected at the impedance transition. The resulting reflection exhibits a phase difference to the signal which may introduce an error into a measurement of the standing wave ratio. Conventional methods for determining the phase difference may suffer from signal leakage and increased circuit complexity.

Hence, there may be a demand for improved phase difference determination.

BRIEF DESCRIPTION OF THE FIGURES

Some examples of apparatuses and/or methods will be described in the following by way of example only, and with reference to the accompanying figures, in which.

DETAILED DESCRIPTION

Figure 1A:
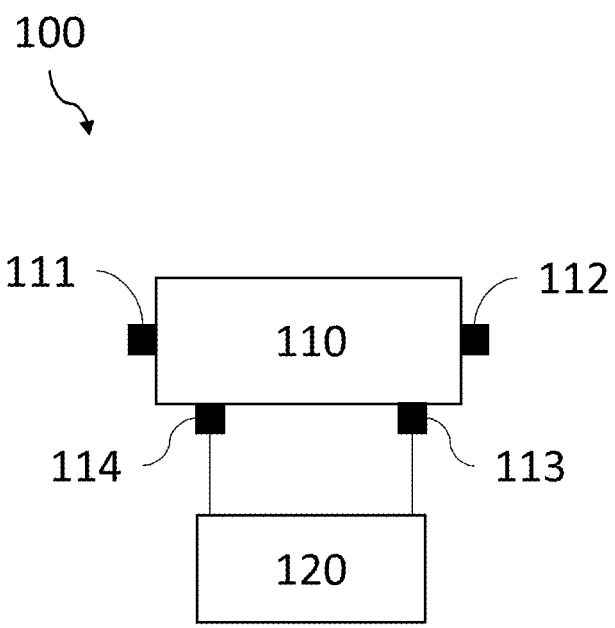
FIG. 1a to FIG. 1e illustrate an example of electronic circuitry.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e., only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1a illustrates an example of electronic circuitry 100. The electronic circuitry 100 comprises a directional coupler 110. The directional coupler 110 comprises a first port 111, a second port 112, a third port 113 and a fourth port 114. The arrangement of ports 111 to 114 at the directional coupler 110 as well as size and shape of the directional coupler 110 shown in FIG. 1a are meant for illustrative purposes only.

The directional coupler 110 may be any circuit to couple an (e.g., predefined) amount of electromagnetic power at the first port 111 and/or the second port 112 to the third port 113 and/or the fourth port 114. For instance, the directional coupler 110 may couple power in a transmission line between the first port 111 and the second port 112 to a transmission line between the third port 113 and/or the fourth port 114.

The directional coupler 110 may couple the power from one port to another, e.g., selectively based on the direction of the power. For instance, the directional coupler 110 may couple, to the third port 113, power coming from a signal source and arriving at the first port 111 (e.g., flowing from the first port 111 towards the second port 112), and couple, to the fourth port 114, power coming from a load and arriving at the second port 112 (e.g., flowing from the second port 112 towards the first port 111).

The directional coupler 110 may, e.g., comprise two coupled transmission lines (or waveguides), e.g., one between the first port 111 and the second port 112 and another one between the third port 113 and the fourth port 114, for coupling the ports 111 to 114 in a predefined manner. For instance, the transmission lines may be arranged close to each other such that power passing through one is coupled to the other.

The directional coupler 110 may, e.g., branch off power flowing between two ports, e.g., first port 111 and second port 112, to the third port 113 or the fourth port 114, e.g., depending on the flow direction of the power. The amount of power which is branched off may be defined by a coupling factor of the directional coupler 110.

The first port 111 is configured to receive an input signal from a signal source (not shown). The second port 112 is configured to output the input signal for transmission to a load (not shown). The input signal may be a desired signal, e.g., encoding information. For instance, the signal source may have generated or output the input signal for transmission to the load and/or further processing by the load. The input signal may in some examples be a modulated radio frequency (RF) signal to be radiated by an antenna (of the load).

The third port 113 is configured to output a forward signal based on the input signal. The third port 113 may output the forward signal by means of the above-mentioned coupling, e.g., between the third port 113 and a transmission line between the first port 111 and the second port 112. Therefore, the forward signal may indicate the input signal.

The forward signal may be electromagnetic power branched off from the input signal, e.g., from power having a forward direction, e.g., power flowing from the signal source towards the load. The forward signal may be indicative of the input signal, e.g., indicative of the amplitude, frequency, shape, or phase of the input signal. For instance, the forward signal may exhibit electrical characteristics with a known (mathematical) relation to the input signal, e.g., defined by the coupling factor, a type of the directional coupler 110 or alike.

The fourth port 114 is configured to output a reverse (backward) signal based on a reflection of the input signal received at the second port 112. The fourth port 114 may output the forward signal by means of the above-mentioned coupling, e.g., between the fourth port 114 and a transmission line between the first port 111 and the second port 112. Therefore, the reverse signal may indicate the reflection.

The reflection may be a part of the input signal reflected off at an impedance transition between the second port 112 and the load. The reverse signal may be electromagnetic power branched off from the reflection, e.g., from power in the transmission line between the first port 111 and the second port 112 having a reverse direction, e.g., power flowing from the load towards the signal source. The reverse signal may be indicative of the reflection, e.g., indicative of the amplitude, frequency, shape, or phase of the reflection. For instance, the reverse signal may exhibit electrical characteristics with a known (mathematical) relation to the reflection.

The occurrence of the reflection may in some examples be an undesired effect caused by limitations in impedance matching between the load and a transmission line connecting or coupling the source with the load. The limitations in impedance matching may, e.g., be due to circuit design considerations or a varying or drifting impedance of the load and/or the transmission line. Depending on the application, it may be desirable to determine the reflection, e.g., for calibration or dynamic adjustment of impedance matching or factory identification of the impedance matching quality.

A time difference between a time of arrival of the input signal and a time of arrival of the reflection at the directional coupler 110 may cause a phase difference between the forward signal and the reverse signal. The time difference may, e.g., depend on an electrical distance (electrical length) between the source and the load, which is in many applications unknown. However, the phase difference may be relevant for the above determination of the reflection. The electronic circuitry 100 may allow to determine said phase difference.

The electronic circuitry 100 comprises a Time-to-Digital Converter (TDC) 120 coupled to the third port 113 and the fourth port 114, e.g., one terminal or port of the TDC 120 may be coupled to the third port 113 and another terminal or port of the TDC 120 may be coupled to the fourth port 114.

It is to be noted that a direct connection of the TDC 120 to the directional coupler 110 shown in FIG. 1a is meant for illustrative purposes only. In other examples, the TDC 120 may be coupled via one or more intermediate electrical components to the directional coupler 110. For instance, said intermediate electrical components may process or modify the forward signal and/or the reverse signal, and output a modified forward signal and/or a modified reverse signal for transmission to the TDC 120.

The TDC 120 is configured to determine the phase difference between the forward signal and the reverse signal.

The TDC 120 may be any circuit for determining (e.g., measuring) the phase difference, e.g., by sampling a signal indicating the (modified) forward signal and/or the (modified) reverse signal. For instance, the TDC 120 may receive a clock signal for sampling the signal in a frequency given by the clock signal. For instance, the TDC 120 may sample the (modified) forward signal and the (modified) reverse signal.

The TDC 120 may, e.g., electrically respond to (recognize) an event, e.g., an arrival of the forward signal and/or an arrival of the reverse signal. For instance, the TDC 120 may start or stop a time measurement or counting when a rising or falling edge of a signal pulse of the signal crosses a predefined threshold which may indicate presence (e.g., arrival) of the forward signal or presence (e.g., arrival) of the reverse signal. The time measurement may be captured in a number of clock cycles of the clock signal, e.g., by quantizing the phase difference to a clock period. For instance, the TDC 120 may be coupled to a register where an occurrence of a (start or stop) event is captured.

The TDC 120 may output a digital (e.g., binary) representation of the phase difference in response to the sampling of the signal. For instance, the TDC 120 may output a notion of a time interval between the two arrivals. In some examples, the TDC 120 may be a time digitizer or a time counter.

By using the TDC 120, the electronic circuitry 100 may provide a measurement of the phase difference between the reverse and forward paths (at port 113 and port 114, respectively) of the directional coupler 110.

In applications where a determination of the reflection coefficient is required, the electronic circuitry 100 may, for example, increase an accuracy of said determination. The electronic circuitry 100 may, e.g., enable a determination of a complex reflection coefficient Γ of the impedance transition, e.g., given as $\Gamma=|\Gamma| \cdot e(j<\Gamma)$, where $|\Gamma|$ is an absolute value of the complex reflection coefficient and $<\Gamma$ is an argument (angle) of the complex reflection coefficient. The argument of the reflection coefficient may depend on the phase difference between forward and reverse signal.

The latter determination of the complex reflection coefficient may be useful for many applications, e.g., real-time identification of bad antenna matching (static/dynamic), specifically, in applications where the directional coupler 110 is located (e.g., in silicon) far away from the load (e.g., an antenna). The determination of the complex reflection coefficient may further be relevant for realization of an integrated antenna/impedance mismatch tuner, improvement of power detection accuracy over different antenna VSWR (voltage standing wave ratio), or factory identification of, e.g., frontend, impedance matching quality. Thus, the electronic circuitry 100 may allow increasing (maximizing) key performance indicators of a signal source (e.g., transmitter) or improving the robustness of the operation of transmitters.

Additionally, the electronic circuitry 100 may enable an inductor-less phase measurement since usage of any inductors for proper operation of the TDC 120 is not necessary. The electronic circuitry 100 may therefore decrease a risk of leakage to such an inductor. Thus, the electronic circuitry 100 may increase an accuracy of the phase difference determination.

Conventionally, phase differences between forward and reverse signals may be measured by a quadrature loopback receiver (LPBK receiver). LPBK receivers may be sensitive to a leakage of a (strong) input signal (e.g., a transmitter signal) since they usually include inductors for matching/filtering purposes. Such inductors may pick up radiation caused by another inductor coupled to (or located at) the output of the signal source (transmitter's output), e.g., for power amplifier matching or as harmonic filter. This leakage may decrease the accuracy of the measurement of phase differences.

For example, in an application with a transmitter operated with a mismatched antenna, knowledge of a complex reflection coefficient may be required. A quadrature receiver may be conventionally used in a sequential way to record the forward and reverse signals, which may preserve both amplitude and phase information of the original input signal and reflection. After time-alignment, the complex reflection coefficient may be determined. A leakage issue may arise if the quadrature receiver includes an inductor, e.g., at its input (for matching or filtering purposes). Leakage may be caused by leaking of a signal transmitted by the transmitter and leaking from an inductor/transformer at an output of the transmitter to an inductor at an input of the quadrature receiver. Such leakage may interfere with the forward and reverse signals and degrade the phase (and magnitude) reading (especially during $V_{rev}$ measurement).

For example, a voltage reflection coefficient derived from a conventional measurement of the phase difference with inductor leakage may yield (in an exemplary representation of the reflection coefficient as ratio between reverse signal and forward signal voltage amplitude): $\Gamma_{meas}=(V_{REV}+V_{leak})/(V_{FW}+V_{leak})$, where $\Gamma_{meas}$ is the measured value of the reflection coefficient, $V_{rev}$ is the value of the voltage amplitude of the reverse signal, $V_{leak}$ is the value of the voltage amplitude of the leaked signal, and $V_{FW}$ is the value of the voltage amplitude of the forward signal. $V_{leak}$ may be unknown and therefore degrade the measurement of the reflection coefficient $\Gamma$ which may be derivable from $\Gamma=V_{REV}/V_{FW}$.

The electronic circuitry 100 may avoid above mentioned leakage and hence decrease loss of precision of the determination of phase differences.

Further, the electronic circuitry 100 may provide advantages in terms of compactness for phase ($\angle\Gamma$) measurements. For instance, silicon area may be reduced since a TDC may consume less area than a quadrature receiver comprising two analog-to-digital converters and two (analog) baseband filters.

Figure 1B:
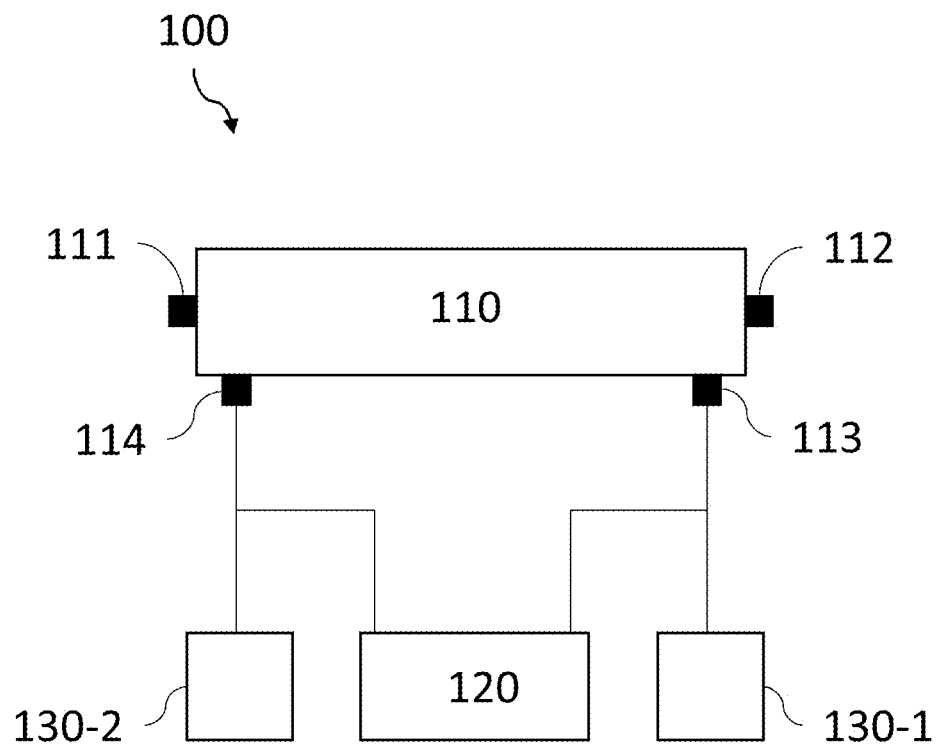

In some examples, such as illustrated by FIG. 1b, the electronic circuitry 100 further comprises a first power detector 130-1 coupled to the third port 113. The first power detector 130-1 is configured to determine a power of the forward signal (forward power). The electronic circuitry 100 further comprises a second power detector 130-2 coupled to the fourth port 114. The second power detector 130-2 is configured to determine a power of the reverse signal (reverse power).

The power detectors 130-1, 130-2 may be any circuits for measuring a power of a signal. For instance, the power detectors 130-1, 130-2 may measure an amplitude, a peak, or an absolute value of the forward or the reverse signal (e.g., of their respective voltages), respectively. The power detectors 130-1, 130-2 may, e.g., be a (e.g., Schottky-) diode-based power detector (e.g., comprising a half wave rectifier).

The implementation of power detectors 130-1, 130-2 may enable the determination of an absolute value of a reflection coefficient of an impedance transition between the second port 112 and the load. For instance, the power detectors 130-1, 130-2 may output a respective signal which indicates the forward power or reverse power, respectively, e.g., based on a transfer function of the power detectors 130-1, 130-2, and send the respective signal to an external component for determination of the reflection coefficient. The additional determination of the argument of the reflection coefficient based on the phase difference may enable an accurate measurement of the reflection coefficient.

Figure 1C:
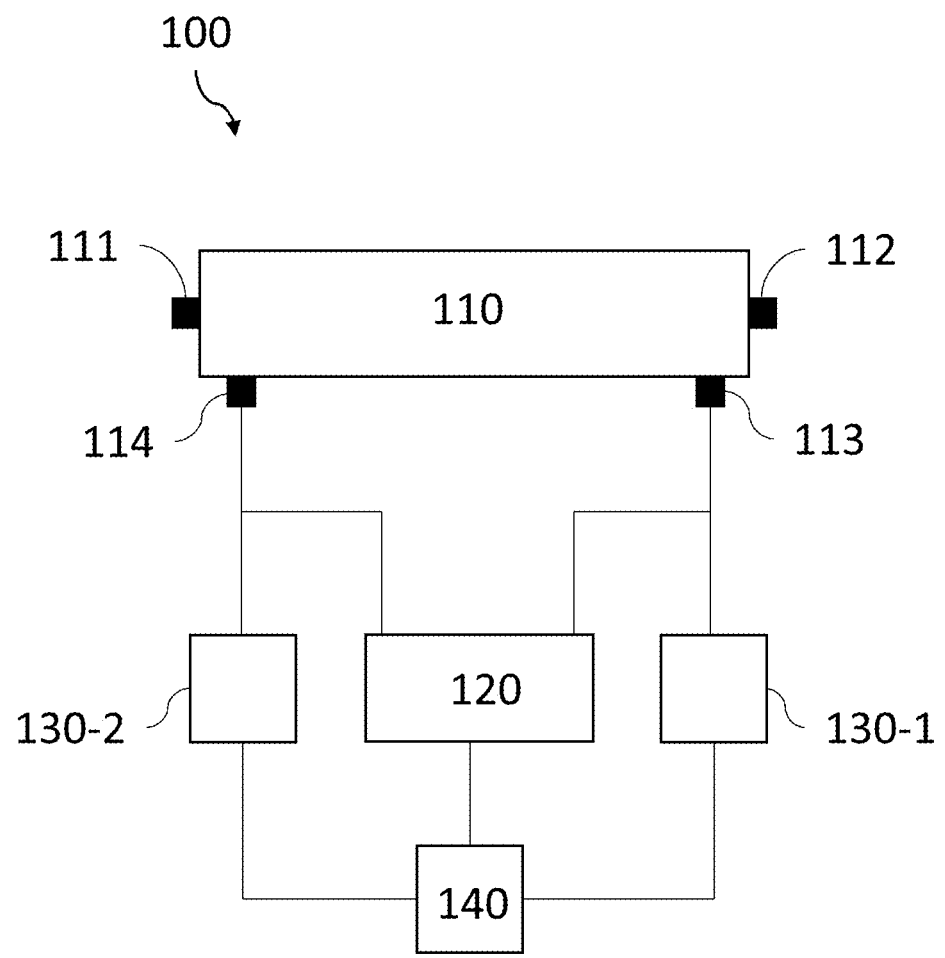

In some examples, such as illustrated by FIG. 1c, the electronic circuitry 100 further comprises processing circuitry 140 coupled to the TDC 120, the first power detector 130-1 and the second power detector 130-2. The processing circuitry 140 is configured to determine the reflection coefficient of the impedance transition between the second port 112 and the load based on the phase difference, the power of the forward signal and the power of the reverse signal. For instance, the processing circuitry 140 may receive, from the TDC 120, the first power detector 130-1 and the second power detector 130-2, a (digital) signal which indicate the phase difference, the forward power and reverse power.

In some examples, the processing circuitry 140 is configured to determine the reflection coefficient by determining an argument of the reflection coefficient based on the phase difference and determining an absolute value of the reflection coefficient based on the power of the forward signal and the power of the reverse signal. The processing circuitry 140 may determine the reflection coefficient, e.g., based on the equation $\Gamma=|\Gamma|\cdot e(j\angle\Gamma)$, as described above.

The processing circuitry 140 may comprise, e.g., a processor, a control unit, a (field) programmable logic array ((F)PLA), a (field) programmable gate array ((F)PGA), a graphics processor unit (GPU), an application-specific integrated circuit (ASIC), an integrated circuit (IC) or a system-on-a-chip (SoC) system programmed to execute the determination of the reflection coefficient.

In some examples, the electronic circuitry 100 further comprises an attenuator (not shown) coupled between the third port 113 and the TDC 120. The attenuator may be any circuit for attenuating a signal, e.g., substantially without or negligibly distorting its waveform. The attenuator may, e.g., be a variable attenuator, i.e., an attenuator with an adjustable gain (loss).

The attenuator is configured to output an attenuated forward signal by attenuating the forward signal based on the power of the forward signal and the power of the reverse signal. For instance, the attenuator may receive a signal indicating the forward power and reverse power or a difference between the forward and reverse power and adapt its gain according to the received signal.

In some examples, the attenuator is configured to attenuate the forward signal such that a difference between an amplitude of the attenuated forward signal and an amplitude of the reverse signal is lower than a difference between an amplitude of the forward signal and the amplitude of the reverse signal. For instance, the attenuator may attenuate the forward signal (e.g., the voltage of the forward signal) such that the resulting amplitude of the attenuated forward signal is substantially equal to the amplitude of the reverse signal. The TDC 120 may be configured to determine the phase difference based on the attenuated forward signal. This may decrease a measurement error of the TDC 120 caused by the signals to be sampled having unequal amplitudes.

Figure 1D:
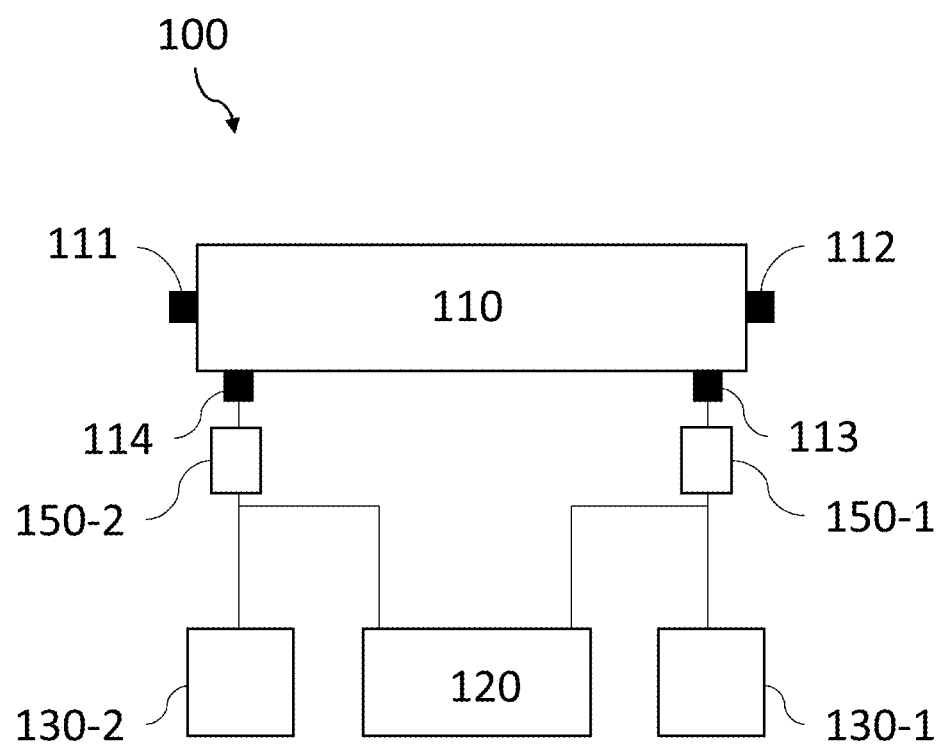

In some examples, such as illustrated by FIG. 1d, the electronic circuitry 100 further comprises a first attenuator 150-1 coupled between the third port 113 and the TDC 120. The electronic circuitry 100 further comprises a second attenuator 150-2 coupled between the fourth port 114 and the TDC 120.

The first attenuator 150-1 is configured to output an attenuated forward signal by attenuating the forward signal based on the power of the forward signal and the power of the reverse signal, and the second attenuator 150-2 is configured to output an attenuated reverse signal by attenuating the reverse signal based on the power of the forward signal and the power of the reverse signal. The TDC 120 is configured to determine the phase difference based on the attenuated forward signal and the attenuated reverse signal.

For instance, the first attenuator 150-1 and the second attenuator 150-2 are configured to attenuate the forward signal and the reverse signal, respectively, such that a difference between an amplitude of (e.g., a voltage of) the attenuated forward signal and an amplitude of (e.g., a voltage of) the attenuated reverse signal is lower than a difference between an amplitude of the forward signal and an amplitude of the reverse signal. For example, the first and the second attenuators 150-1, 150-2 may attenuate the forward signal and the reverse signal, respectively, such that the resulting amplitude of the attenuated forward signal is substantially equal to the resulting amplitude of the attenuated reverse signal. This may decrease a measurement error of the TDC 120 caused by the signals to be sampled having unequal amplitudes.

Figure 1E:
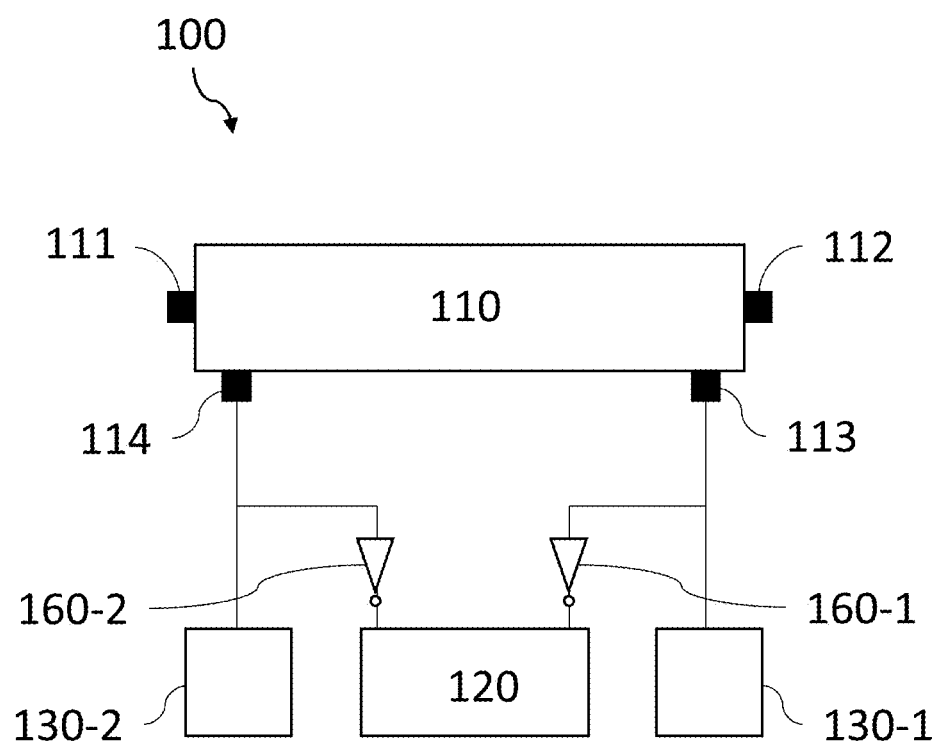

In some examples, such as illustrated by FIG. 1e, the electronic circuitry 100 further comprises a first inverter 160-1 coupled between the third port 113 and the TDC 120. The electronic circuitry 100 further comprises a second inverter 160-2 coupled between the fourth port 114 and the TDC 120. The first invertor 160-1 is configured to output a first square wave based on the forward signal, and the second invertor 160-2 is configured to output a second square wave based on the reverse signal. For instance, the inverters 160-1, 160-2 may clip the (modified) forward signal or reverse signal, respectively, e.g., before input of the square waves into the TDC 120.

The TDC 120 is configured to determine the phase difference based on the first square wave and the second square wave. For instance, the TDC 120 may sample the first square wave and the second square wave for determining a time interval between an occurrence of the first square wave and an occurrence of the second square wave, wherein said time interval may indicate the phase difference between forward and reverse signal. The clipping and/or squaring provided by the inverters 160-1, 160-2 may increase the accuracy of the determination of the phase difference by the TDC 120 since the TDC 120 may operate with reduced error-proneness when processing squared rail-to-rail input signals.

In some examples, the electronic circuitry 100 may comprise the attenuator/attenuators, as described above, as well as the inverters. This may improve the characteristics of a signal to be sampled by the TDC 120 for more accurate determination of the phase difference.

The electronic circuitry 100 may enable improved power detection accuracy over various antenna VSWR.

The electronic circuitry 100 may further enable an integrated antenna or impedance mismatch tuning. For instance, the electronic circuitry 100 may output a signal indicating the phase difference (or the reflection coefficient) which is to be received by an impedance matching circuit which, in turn, may adjust an impedance of the load (e.g., antenna) or the transmission line coupled to the load based on said signal for reducing impedance mismatches.

In some examples, the electronic circuitry 100 may use a TDC to measure a phase difference between the forward and reverse signals This may provide the phase of the reflection coefficient $\sphericalangle\Gamma=\Gamma(V_{REV}/V_{FW})=\sphericalangle V_{REV}-\sphericalangle V_{FW}$. The magnitude (absolute value) of the reflection coefficient may be derived from the ratio of the power of reverse signal to the power of the forward signal $|\Gamma|=P_{REV}/P_{FW}$. These power levels may be measured by power detectors. The complex reflection coefficient may be derived from: $\Gamma=|\Gamma|\cdot e^{(j\sphericalangle\Gamma)}$ The measurement workflow may be performed as following: The measurements may be done with a modulated input signal which may be required by various regulation bodies. Step 1 may be that the electronic circuitry 100 measures forward and reverse power by means of power detectors. Step 2 may be that the electronic circuitry 100 equates the forward and reverse power by using variable attenuators which may minimize the TDC measurement error caused by unequal amplitude signals. Step 3 may be that the electronic circuitry 100 measures the phase difference between the forward and reverse signals by means of a TDC. Sub-step A may be that the electronic circuitry 100 uses an input signal that is partially clipped for only a short duration for measuring the phase difference only during this clipped duration. Sub-step B may be that the electronic circuitry 100 clips/squares the forward and reverse signals by means of invertors before TDC input.

Figure 2:
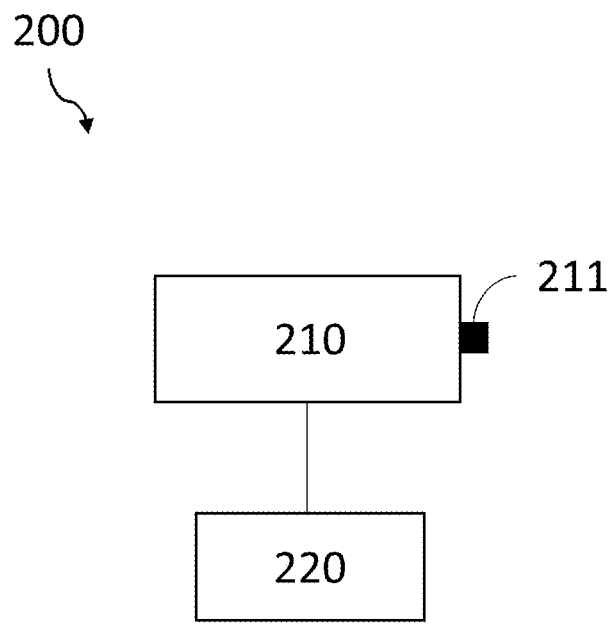
FIG. 2 illustrates another example of electronic circuitry.

FIG. 2 illustrates another example of electronic circuitry 200. The electronic circuitry 200 comprises a directional coupler 210 and a TDC 220 coupled to the directional coupler 210. The TDC 220 is configured to receive, from the directional coupler 210, a forward signal generated by the directional coupler 210 based on an input signal received by the directional coupler 210 from a signal source.

The TDC 220 is further configured to receive, from the directional coupler 210, a reverse signal based on a reflection of the input signal received by the directional coupler 210 at a port 211 for outputting the input signal to a load.

The TDC 220 is further configured to determine a phase difference between the forward signal and the reverse signal.

More details and aspects of the electronic circuitry 200 are explained in connection with the proposed technique or one or more examples described above (e.g., FIGS. 1a to 1e). The electronic circuitry 200 may comprise one or more additional optional features corresponding to one or more aspects of the proposed technique, or one or more examples described above.

In some examples, the electronic circuitry 200 further comprises a first power detector and a second power detector coupled to the directional coupler 210. The first power detector is configured to determine a power of the forward signal. The second power detector is configured to determine a power of the reverse signal. For example, the electronic circuitry 200 may comprise a first power detector and a second power detector in a configuration illustrated by FIG. 1b.

In some examples, the electronic circuitry 200 further comprises processing circuitry coupled to the TDC 220, the first power detector and the second power detector. The processing circuitry is configured to determine a reflection coefficient of an impedance transition between the port for outputting the input signal and the load based on the phase difference, the power of the forward signal and the power of the reverse signal. For example, the electronic circuitry 200 may comprise processing circuitry in a configuration illustrated by FIG. 1c. For example, the processing circuitry may be configured to determine the reflection coefficient by determining an argument of the reflection coefficient based on the phase difference and determining an absolute value of the reflection coefficient based on the power of the forward signal and the power of the reverse signal.

In some examples, the electronic circuitry 200 further comprises an attenuator coupled between the directional coupler 210 and the TDC 220. The attenuator is configured to output an attenuated forward signal by attenuating the forward signal based on the power of the forward signal and the power of the reverse signal. The TDC 220 is configured to determine the phase difference based on the attenuated forward signal. For example, the attenuator may be configured to attenuate the forward signal such that a difference between an amplitude of the attenuated forward signal and an amplitude of the reverse signal is lower than a difference between an amplitude of the forward signal and the amplitude of the reverse signal.

In some examples, the electronic circuitry 200 further comprises a first attenuator and a second attenuator coupled between the directional coupler 210 and the TDC 220. The first attenuator is configured to output an attenuated forward signal by attenuating the forward signal based on the power of the forward signal and the power of the reverse signal and the second attenuator is configured to output an attenuated reverse signal by attenuating the reverse signal based on the power of the forward signal and the power of the reverse signal. The TDC 220 is configured to determine the phase difference based on the attenuated forward signal and the attenuated reverse signal. For example, the electronic circuitry 200 may comprise a first attenuator and a second attenuator in a configuration illustrated by FIG. 1d. For example, the first attenuator and the second attenuator may be configured to attenuate the forward signal and the reverse signal, respectively, such that a difference between an amplitude of the attenuated forward signal and an amplitude of the attenuated reverse signal is lower than a difference between an amplitude of the forward signal and an amplitude of the reverse signal.

In some examples, the electronic circuitry 200 further comprises a first inverter and a second inverter coupled between the directional coupler 210 and the TDC 220. The first invertor is configured to output a first square wave based on the forward signal and the second invertor is configured to output a second square wave based on the reverse signal. The TDC 220 is configured to determine the phase difference based on the first square wave and the second square wave. For example, the electronic circuitry 200 comprises a first inverter and a second inverter in a configuration illustrated by FIG. 1e.

The electronic circuitry 200 may enable a measurement of the phase difference, e.g., for reflection coefficient determination. The electronic circuitry 200 may increase an accuracy of the reflection coefficient determination. The electronic circuitry 200 may decrease a footprint needed for performing the measurement of the phase difference.

Figure 3:
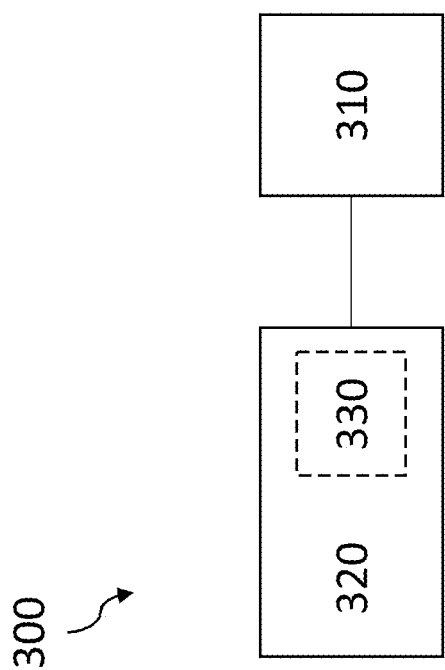
FIG. 3 illustrates an example of a system.

FIG. 3 illustrates an example of a system 300. The system 300 comprises an electronic circuitry 310 as described herein, such as electronic circuitry 100 or 200, and the signal source 320. The signal source 320 is configured to generate the input signal.

The signal source 320 may be, e.g., coupled to the directional coupler of the electronic circuitry 310. The signal source 320 may output the input signal and transmit the input signal, e.g., via a transmission line, to the load. The transmission line may be coupled to at least one primary port of the directional coupler such that signals conducting in the transmission line cause at least one secondary port of the directional coupler to output the forward signal and the reverse signal.

The signal source 320 may comprise (or be) any circuit for generating the input signal, such as a transmitter, an RF signal generator, a function generator, a pulse generator, or an arbitrary waveform generator. The input signal may be a modulated RF signal, for instance.

In some examples, the signal source 320 comprises a transmitter configured to generate a transmit signal. The input signal is based on the transmit signal. For instance, the input signal may be generated by modifying (filtering, amplifying or alike) the transmit signal.

In some examples, the signal source 320 further comprises an (optional) impedance matching circuit 330 coupled between the transmitter and the directional coupler. The impedance matching circuit 330 is configured to generate the input signal based on the transmit signal.

The impedance matching circuit 330 may be any circuit suitable for impedance matching, e.g., between the signal source 320 and the load. The impedance matching may aim at increasing power transfer from the signal source 320 to the load and/or at decreasing reflections. For instance, the impedance matching circuit 330 may comprise a transformer, an inductor, or an (e.g., adjustable) network of lumped resistance, capacitance, and inductance.

In some examples, the system 300 further comprises a semiconductor die. The electronic circuitry 310 and the signal source 320 may integrated into the (same) semiconductor die. This may reduce production costs of the system 300.

In some examples, at least part of the input signal is clipped. For instance, the system 300 may comprise a clipper or clamper to clip the part of the input signal. Clipping may refer to a type of distortion of an original signal (e.g., the transmit signal) such that at least part of the input signal is limited to a certain threshold. Clipping may cause the clipped part of the input signal to be a flat cutoff or a reduced signal (with the original waveform at reduced gain).

For instance, a clipping circuit, e.g., upstream or downstream of the signal source 320 or integrated into the signal source 320, may be controlled to clip the part of the input signal when the determination of the phase difference is desired. The TDC of the electronic circuitry 310 may be configured to determine the phase difference based on a part of the forward signal which is based on the clipped part of the input signal.

In some examples, the input signal comprises a preamble part and a payload part. At least part of the payload part may be clipped. For instance, the clipping circuit may be controlled to clip the part of the payload part for a certain time, e.g., a short duration. For example, the input signal may be a WLAN (Wireless Local Area Network) signal and the clipping may be applied to a small portion of the payload such that few, e.g., only one, modulation symbols (out of many) are modified by the clipping. This may limit the introduction of disturbance into the input signal, preferably such that clipping only negligibly degrades performance such as EVM (Error Vector Magnitude).

The TDC may be configured to determine the phase difference based on a part of the forward signal which is based on the clipped part of the payload part. For example, the TDC may determine the phase difference only during a clipping mode, when the clipping is applied, or based on that part of the forward signal which indicates the clipped part of the input signal.

Clipping of a part of the input signal (e.g., the payload of the input signal) may be advantageous to ensure that the forward and reverse signal have a substantially constant amplitude and a square wave form. This may improve the measurement accuracy achieved by the TDC since TDC may "prefer" squared rail-to-rail signals at its inputs.

Figure 4A:
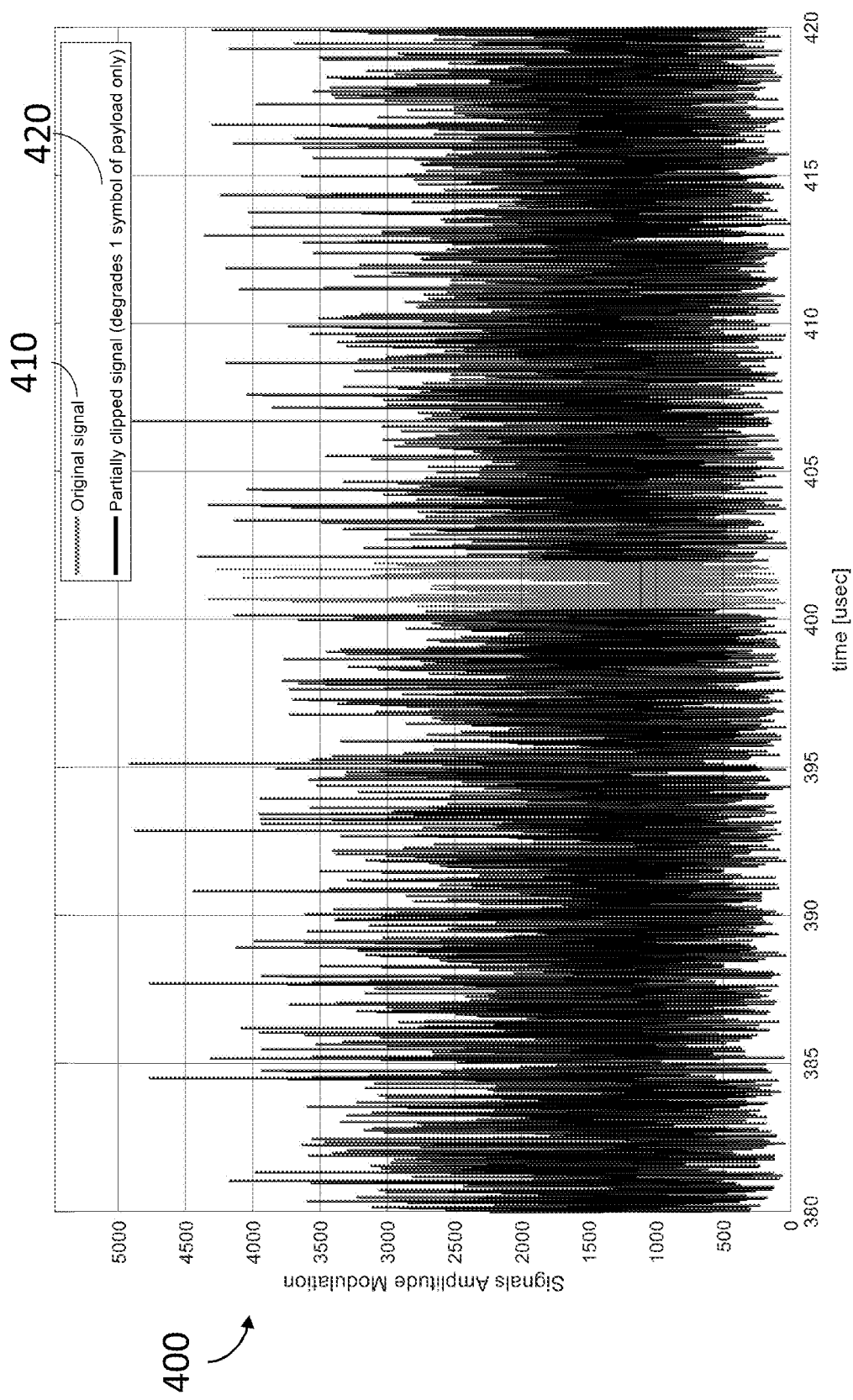
FIG. 4a and FIG. 4b illustrate two examples of an input signal.
Figure 4B:
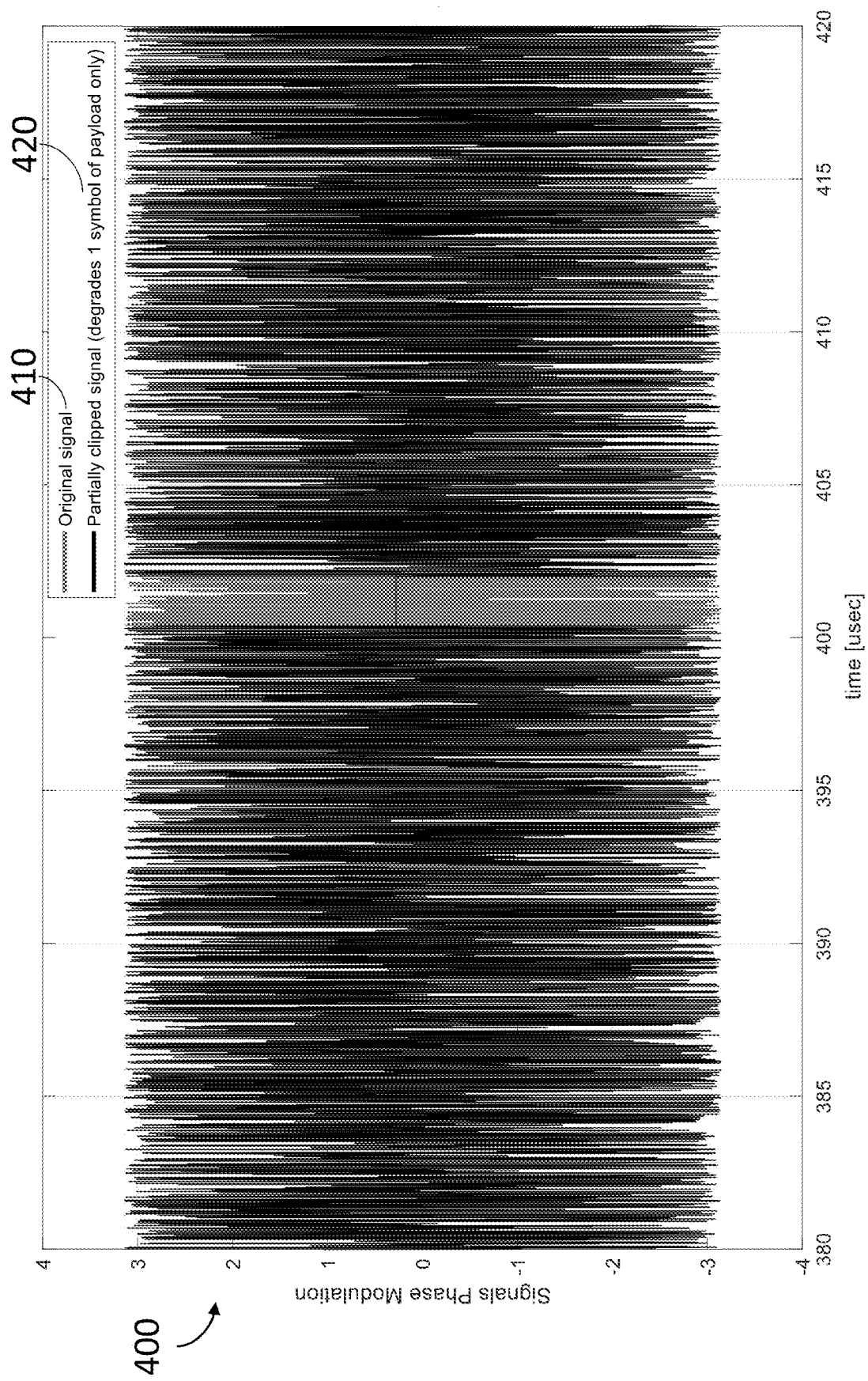

Two examples of an input signal 400 (or a part thereof) exhibiting amplitude modulation or phase modulation, respectively, are illustrated by FIG. 4a and FIG. 4b. The input signal 400 is illustrated as an amplitude course or phase course, respectively, over time. In the example of FIG. 4a and FIG. 4b, an exemplary time interval between 380 and 420 microseconds is shown.

The input signal 400 comprises an original signal 410 (without clipping) and a (small) clipped part 420. In the example of FIG. 4a and FIG. 4b, 1 symbol of the payload of the input signal 400 is clipped approximately after the 400$^{th}$ microsecond.

Figure 5:
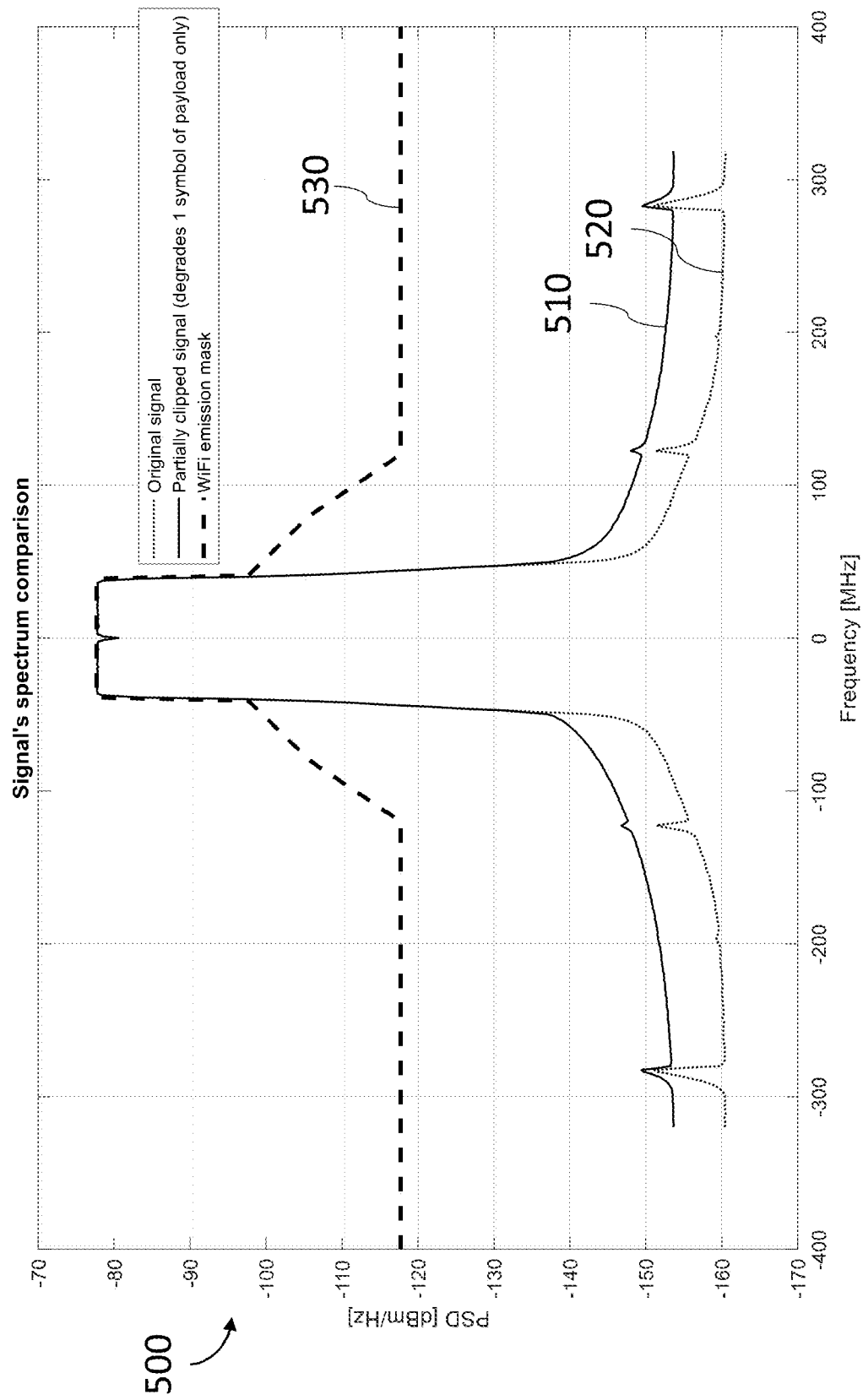
FIG. 5 illustrates an example of a power spectral density.

FIG. 5 illustrates an example of a power spectral density (PSD) 500 of an example of an input signal 510 comprising a clipped part, such as the input signal 400, a reference signal 520 without clipping and a transmit (e.g., WLAN) spectrum mask 530. The PSD 500 describes a respective power (for example, expressed in decibel milliwatt per hertz) carried by the signals 510, 520, 530 over frequency. The PSD 500 shows that a degradation of the input signal 510 caused by the clipping may be negligible in comparison to the reference signal 520.

Referring back to FIG. 3, the system 300 may in some examples further comprise the load. For example, the load may comprise at least one antenna configured to radiate a radio frequency transmit signal based on the input signal. The load may comprise at least one radio frequency frontend coupled between the antenna and the directional coupler. The frontend may be configured to output a radio frequency antenna signal based on filtering and/or duplexing of the input signal. The antenna may be configured to radiate the radio frequency transmit signal based on the radio frequency antenna signal.

Figure 6A:
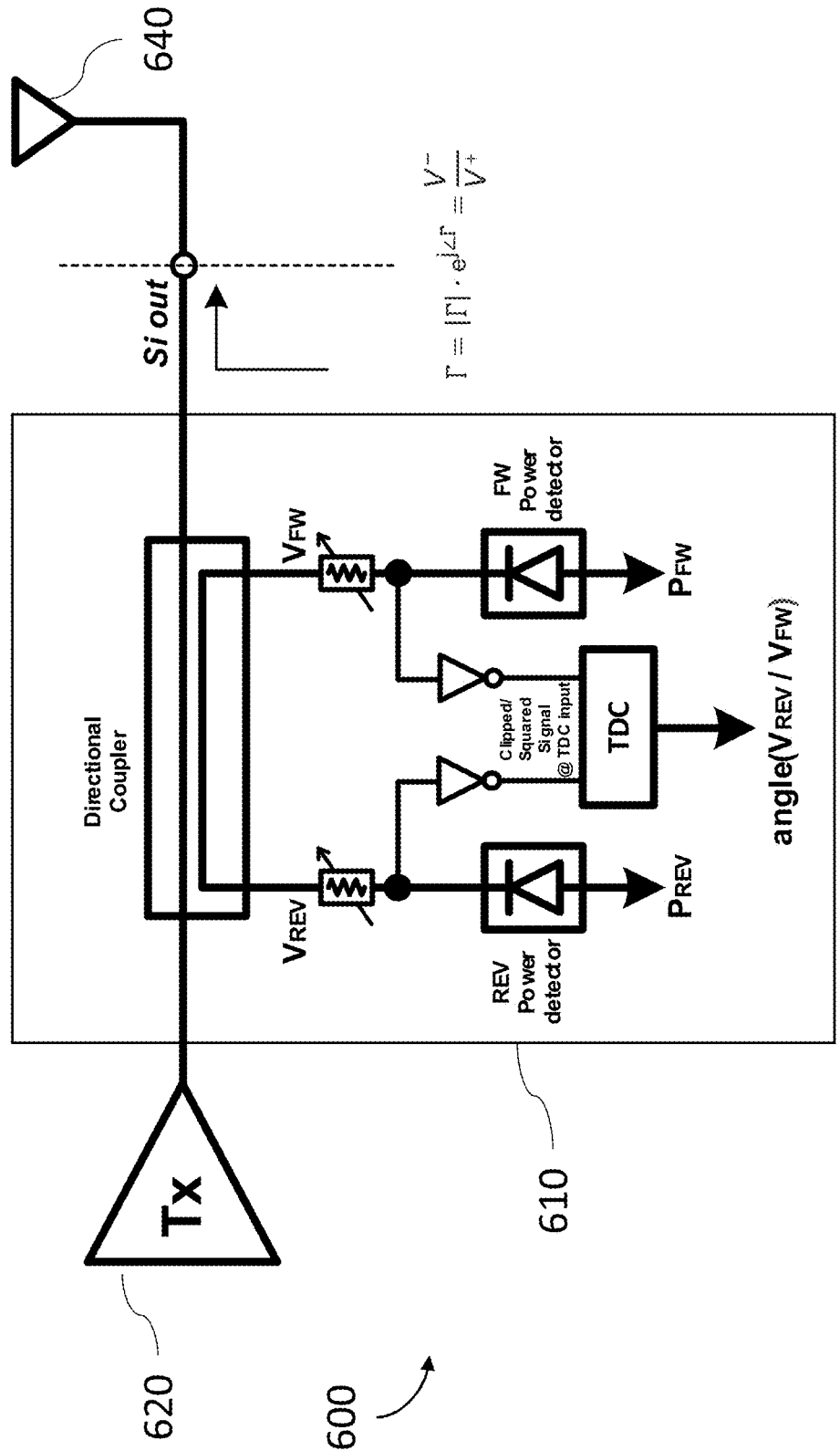
FIG. 6a and FIG. 6b illustrate another example of a system.

The latter is further explained with reference to FIG. 6a and FIG. 6b which illustrate another example of a system 600.

The system 600 comprises an electronic circuitry 610 as described herein. In FIG. 6a, exemplary details of the electronic circuitry 610 are shown: The electronic circuitry 610 comprises a directional coupler, a TDC a first power detector and a second power detector, a first attenuator, a second attenuator, a first inverter and a second inverter. The details shown in FIG. 6a may be further explained with reference to the electronic circuitry 100 and 200. It is to be noted that in other examples the electronic circuitry 610 may exhibit any other configuration (architecture) than the one shown in FIG. 6a, for example, a configuration illustrated by any of the FIGS. 1a to 1e or FIG. 2.

The system 600 further comprises the signal source 620. The signal source 620 is configured to generate the input signal. The signal source 620 comprises a transmitter configured to generate a transmit signal. The input signal may be based on the transmit signal.

Figure 6B:
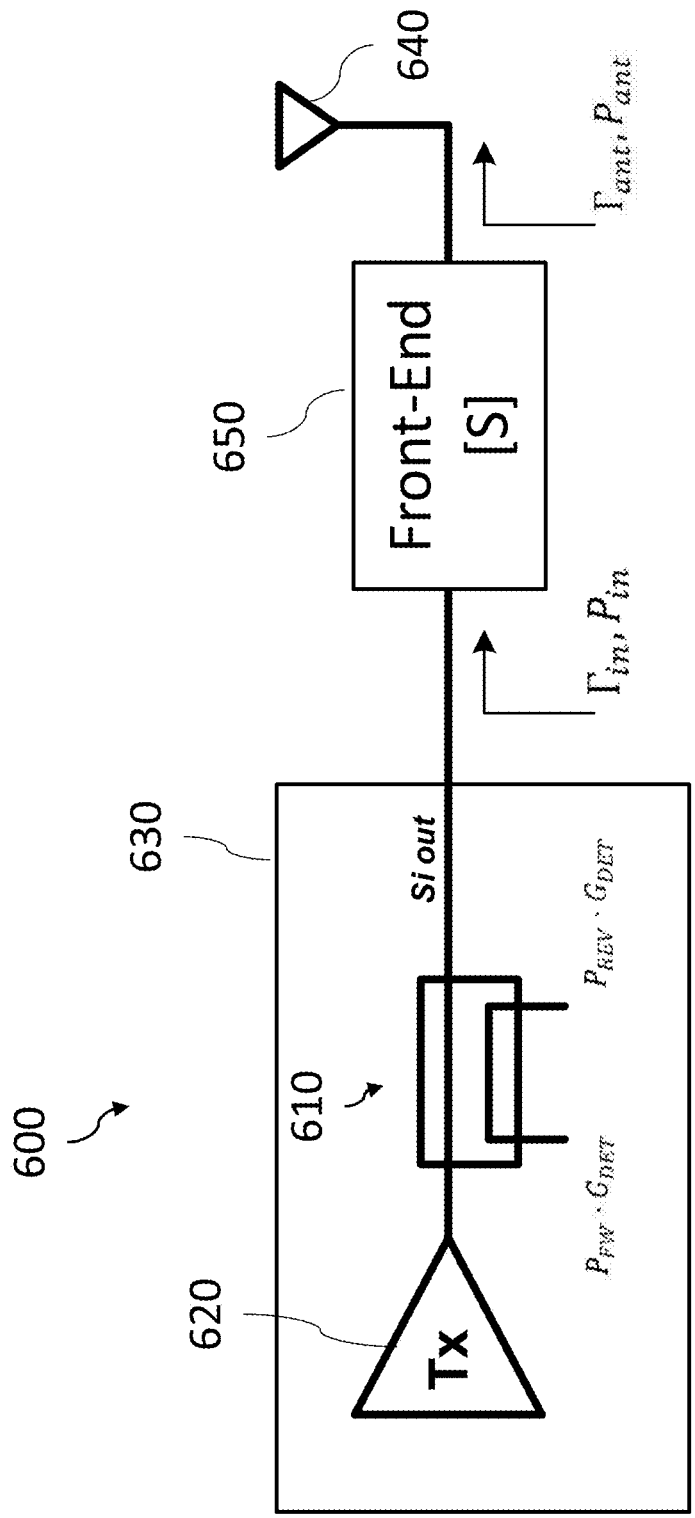

In FIG. 6b, the system 600 further comprises a semiconductor die 630. The electronic circuitry 630 and the signal source 620 are integrated into the semiconductor die 630.

The system 600 further comprises the load 640. The load 640 comprises at least one antenna configured to radiate a radio frequency transmit signal based on the input signal.

In FIG. 6b, the load 640 comprises at least one radio frequency frontend 650 coupled between the antenna and the directional coupler. The frontend 650 is configured to output a radio frequency antenna (frontend output) signal based on filtering and/or duplexing of the input signal. The antenna is configured to radiate the radio frequency transmit signal based on the radio frequency antenna signal. The technique described herein may exhibit further advantages in an architecture where the frontend 650 is between the antenna and the directional coupler since with a conventional system an error in the determination of the reflection coefficient may be increased, as explained in the following.

The frontend 650 may exhibit characteristics described by a scattering matrix S, e.g., measured in a 50 ohm environment, which is coupled (placed) between transmitter and antenna.

In an exemplary application of the system 600, a power detection is performed. The relevant power may be the power Pant delivered to the antenna. However, since the frontend 650 is coupled between the electronic circuitry 610 and the antenna, the electronic circuitry 610 may measure the power delivered to the frontend 650. This may cause a power measurement error.

This error may have been calibrated in factory for the case that the reflection coefficient of an impedance transition between the frontend 250 and the antenna $\Gamma_{ant}$=0 and the impedance of the antenna $Z_{ant}$=50Ω. However, the calibration may be invalid once $\Gamma_{ant} \neq 0$. In some cases, the reflection coefficient may exhibit an angle $|\Gamma_{ant}| \leq 0.33$ which corresponds to a VSWR of 2:1. In some cases, the angle may degrade to $|\Gamma_{ant}| \approx 0.5$ which corresponds to a VSWR of 3:1.

The power detection error may be derived in dependence of S and $\Gamma_{ant}$, by the following analysis: The power $P_{in}$ delivered to the frontend 650 (e.g., measured by a power detector coupled to the directional coupler) may be derived based on Equation 1:

$$P_{in} = P_{FW} - P_{REV} \qquad \text{Equation 1}$$

Where $P_{FW}$ is the power of the forward signal and $P_{REV}$ is the power of the reverse signal. The power gain $G_p$ for a given frontend 650, described by scattering matrix [S], $\Gamma_{ant}$, $\Gamma_{in}$ (reflection coefficient of an impedance transition between the directional coupler and the frontend 650) may be derived based on Equation 2:

$$G_p = \frac{|S_{21}|^2 \cdot (1 - |\Gamma_{ant}|^2)}{(1 - |\Gamma_{in}|^2) \cdot |1 - S_{22} \cdot \Gamma_{ant}|^2} \qquad \text{Equation 2}$$

Where $\Gamma_{in}$ may be derived based on Equation 3:

$$\Gamma_{in} = S_{11} + \frac{S_{12} \cdot S_{21} \cdot \Gamma_{ant}}{1 - S_{22} \cdot \Gamma_{ant}} \qquad \text{Equation 3}$$

The power delivered to the antenna may be derived based on Equation 4:

$$P_{ant} = P_{in} \cdot G_p = (P_{FW} - P_{REV}) \cdot G_p \qquad \text{Equation 4}$$

$G_p$ may be calibrated in factory in 50 ohm environment (assuming $Z_{ant}$=50Ω, $\Gamma_{ant}$=0 and $\Gamma_{in}$=$S_{11}$), yielding $G_{p\text{-}cal}$ of Equation 5 and Equation 6:

$$G_{p\text{-}cal} = P_{ant}(\Gamma_{ant} = 0) - P_{in} \qquad \text{Equation 5}$$

$$G_{p\text{-}cal} = G_p(\Gamma_{ant} = 0) = \frac{|S_{21}|^2}{(1 - |S_{11}|^2)} \qquad \text{Equation 6}$$

Where Equation 5 may describe the actual calibration procedure and Equation 6 may describe its analytical formula in terms of the scattering parameters of the frontend 650.

Based on Equation 5, the power estimated to be delivered to the antenna $P_{ant\text{-}est}$ may be derived based on Equation 7:

$$P_{ant\text{-}est} = P_{in} \cdot G_{p\text{-}cal} \quad \text{Equation 7}$$

The actual power delivered to the antenna may be derived based on Equation 4. The estimation error $\epsilon_{est}$ may be derived based on Equation 8:

$$\epsilon_{est} = \frac{P_{ant}}{P_{ant\text{-}est}} \quad \text{Equation 8}$$

$$= \frac{P_{in} \cdot G_p}{P_{in} \cdot G_{p\text{-}cal}}$$

$$= \frac{G_p}{G_{p\text{-}cal}}$$

$$= \frac{|S_{21}|^2 \cdot (1 - |\Gamma_{ant}|^2)}{(1 - |\Gamma_{in}|^2) \cdot |1 - S_{22} \cdot \Gamma_{ant}|^2} \cdot \frac{(1 - |S_{11}|^2)}{|S_{21}|^2}$$

$$= \frac{(1 - |\Gamma_{ant}|^2) \cdot (1 - |S_{11}|^2)}{(1 - |\Gamma_{in}|^2) \cdot |1 - S_{22} \cdot \Gamma_{ant}|^2}$$

Equation 8 may demonstrate that, in order to compensate for $\epsilon_{est}$, it may be necessary to measure the complex $\Gamma_{in}$, [S] and estimate a complex $\Gamma_{ant}$. The phase measurement of $\Gamma_{in}$ may therefore be a requirement for many applications.

The systems 300 and 600 may enable a measurement of the phase difference, e.g., for reflection coefficient determination. The systems 300 and 600 may increase an accuracy of the reflection coefficient determination. The systems 300 and 600 may decrease a footprint needed for performing the measurement of the phase difference.

Figure 7:
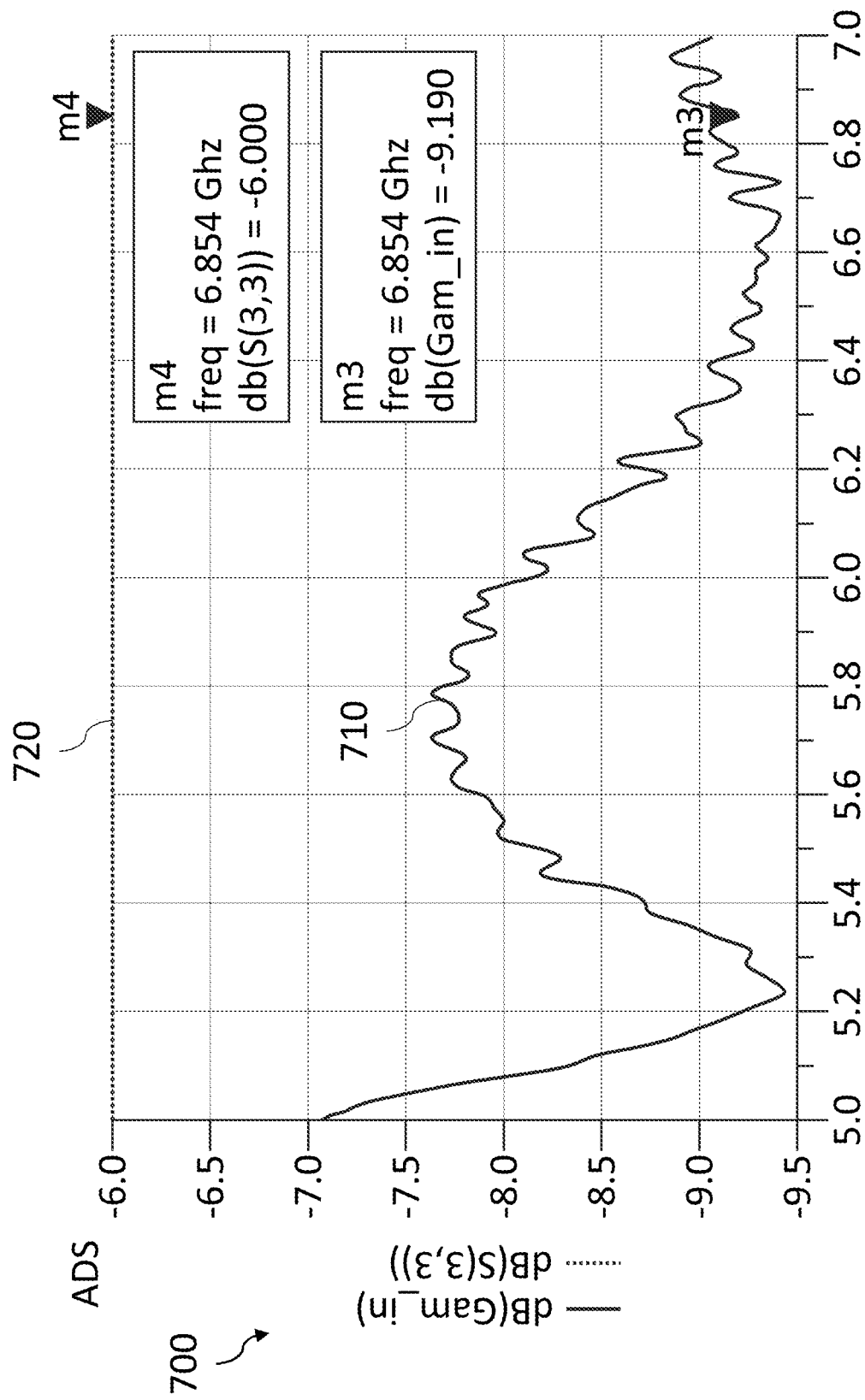
FIG. 7 illustrates an example of an angle course of a reflection coefficient over frequency.

FIG. 7 illustrates an exemplary angle course 700 of a reflection coefficient over frequency for an example of a system as described herein, such as system 300 and 600, and comprising a frontend exhibiting a scattering matrix S. The angle course 700 comprises a first angle course 710 of a reflection coefficient of an impedance transition to the frontend and a second angle course 720 of a reflection coefficient of an impedance transition to an antenna coupled to the frontend. The second angle course is constant (for $(|\Gamma_{in}|)=0.5$).

Figure 8:
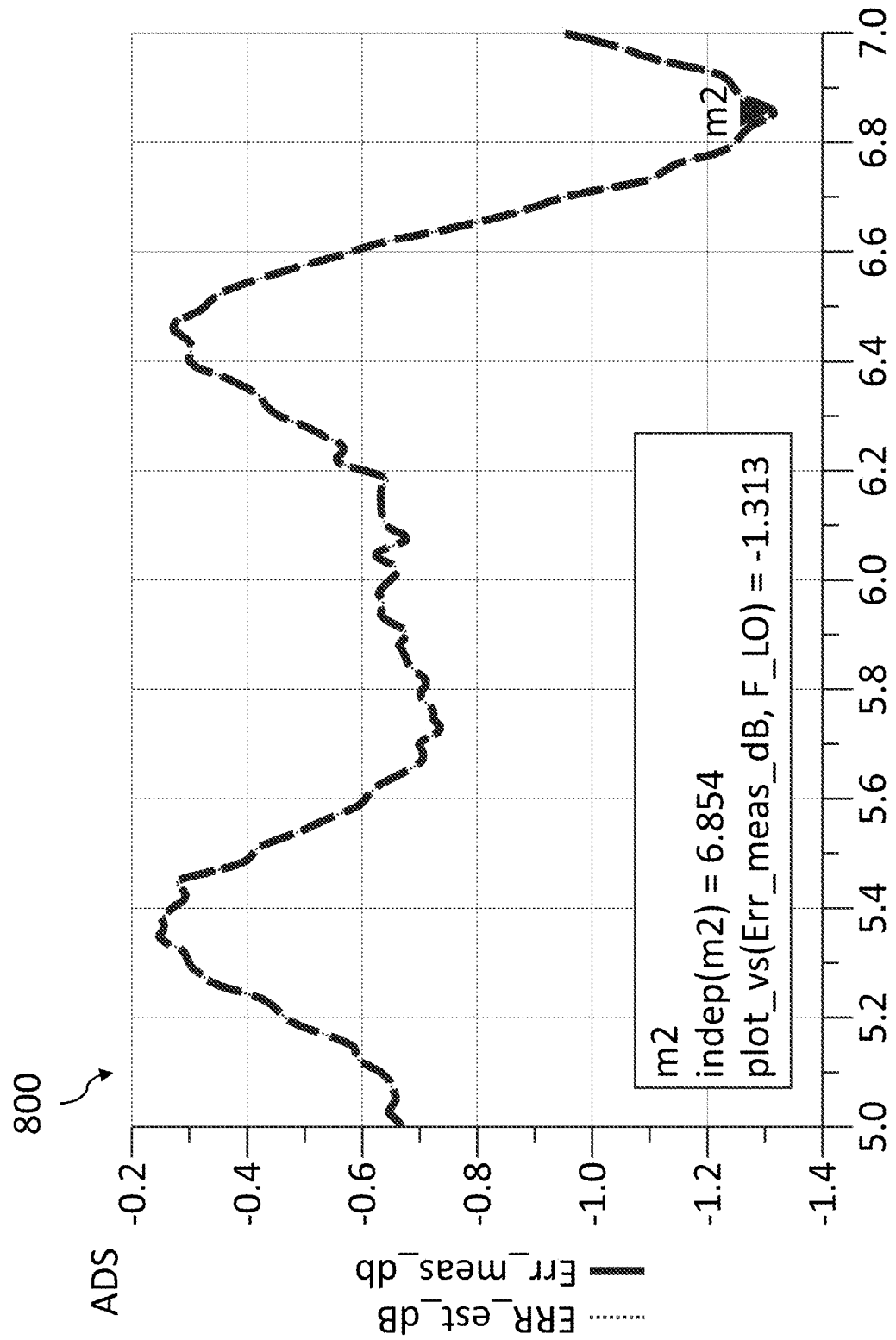
FIG. 8 illustrates an example of a power detection error over frequency.

FIG. 8 illustrates an exemplary power detection error 800, caused by $|\Gamma_{ant}| \neq 0$, over frequency. In the example shown in FIG. 8, the power detection error 800 reaches up to 1.3 dB (decibel). In some applications, an overall error budget may be required to be below 1 dB. This error budget may also be occupied by the variation of the power detector over PVTF (power, voltage, temperature, frequency) and may have no margin for the power detection error 800.

Figure 9:
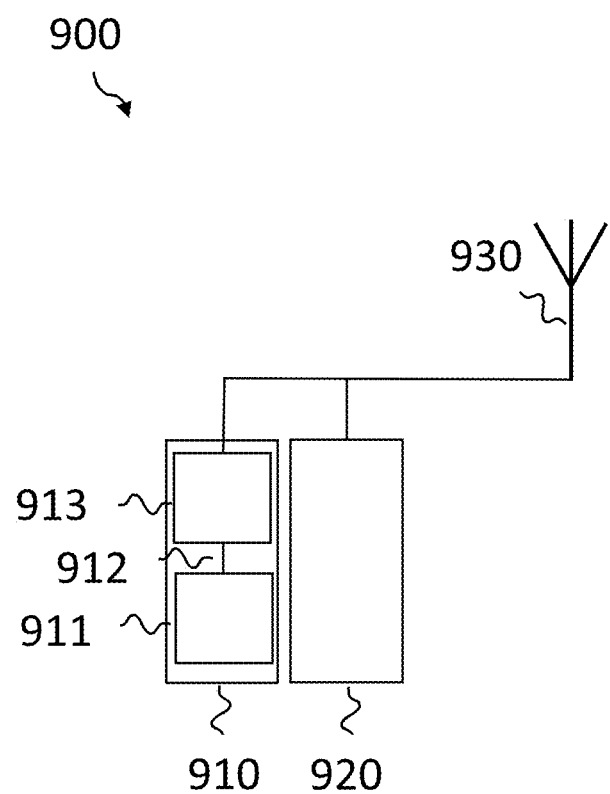
FIG. 9 illustrates an example of a base station.

An example of an implementation using a system according to one or more aspects of the architecture described above in connection with FIG. 3, FIG. 6a and FIG. 6b or one or more examples described above in connection with FIGS. 1 to 8 is illustrated in FIG. 9. FIG. 9 schematically illustrates an example of a radio base station 900 (e.g., for a femtocell, a picocell, a microcell or a macrocell).

The base station 900 comprises a system 910 (transmitter) as proposed and a receiver 920 configured to receive a radio frequency signal. The base station 900 comprises at least one antenna 930 coupled to the receiver 920. The receiver 920 may be coupled to the antenna element 930 via one or more intermediate element such as one or more of a signal line, a filter, etc.

The transmitter 910 may be configured to generate an RF transmit signal based on an input signal. The transmitter 910 may use the antenna element 930 or another antenna element (not illustrated) of the base station 900 for radiating the RF transmit signal to the environment. For example, the transmitter 910 may be coupled to the antenna element 930 via one or more intermediate elements such as a frontend, a filter, an up-converter (mixer) or a Power Amplifier (PA).

The base station 900 further comprises a baseband processing circuitry 911 configured to output digital transmit data 912. The signal source 913 may be configured to generate the input signal based on the digital transmit data 921.

The receiver 920 additionally comprises analog circuitry. The analog circuitry may comprise various elements such as one or more of a Low-Noise Amplifier (LNA), a filter, a down-converter (mixer), ElectroStatic Discharge (ESD) protection circuitry, an attenuator etc. For example, the analog circuitry may be configured to generate an analog input signal based on an RF receive signal received from the antenna element 930 or another antenna element (not illustrated) of the base station 900.

To this end, a base station with improved power measurement may be provided allowing the base station to achieve increased efficiency.

The base station 900 may comprise further elements such as, e.g., an application processor, baseband processing circuitry, memory, a network controller, a user interface, power management circuitry, a satellite navigation receiver, a network interface controller or power tee circuitry.

In some aspects, the application processor may include one or more Central Processing Unit (CPU) cores and one or more of cache memory, a Low-DropOut (LDO) voltage regulator, interrupt controllers, serial interfaces such as Serial Peripheral Interface (SPI), Inter-Integrated Circuit (I²C) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some examples, the baseband processing circuitry 911 may be implemented, for example, as a solder-down substrate including one or more integrated circuits, a single packaged integrated circuit soldered to a main circuit board or a multi-chip module containing two or more integrated circuits.

In some examples, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some examples, the power management (integrated) circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some examples, the power tee circuitry may provide for electrical power drawn from a network cable to provide both power supply and data connectivity to the base station using a single cable.

In some examples, the network controller may provide connectivity to a network using a standard network interface protocol such as Ethernet. Network connectivity may be provided using a physical connection which is one of electrical (commonly referred to as copper interconnect), optical or wireless.

In some examples, the satellite navigation receiver may include circuitry to receive and decode signals transmitted by one or more navigation satellite constellations such as the Global Positioning System (GPS), GLObalnaya NAvigatSionnaya Sputnikovaya Sistema (GLONASS), Galileo and/ or BeiDou. The receiver may provide data to the application processor which may include one or more of position data or time data. The application processor may use time data to synchronize operations with other radio base stations.

In some examples, the user interface may include one or more of physical or virtual buttons, such as a reset button, one or more indicators such as Light Emitting Diodes (LEDs) and a display screen.

Figure 10:
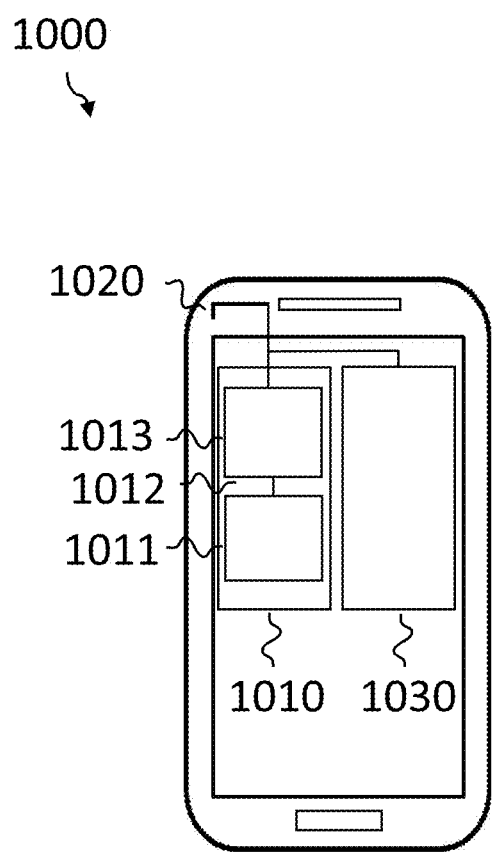
FIG. 10 illustrates an example of a mobile device.

Another example of an implementation using a system according to one or more aspects of the architecture described above in connection with FIG. 3, FIG. 6a and FIG. 6b or one or more examples described above in connection with FIGS. 1 to 9 is illustrated in FIG. 10. FIG. 10 schematically illustrates an example of a mobile device 1000 (e.g., mobile phone, smartphone, tablet-computer, or laptop) comprising a system 1010 (transmitter) as proposed.

The mobile device 1000 comprises at least one antenna element 1020. The mobile device 1000 comprises a receiver 1030 coupled to the antenna element 1020. The receiver 1030 may be coupled to the antenna element 1020 via one or more intermediate element such as one or more of a signal line, a filter, etc. The receiver 1030 may be configured to generate a radio frequency transmit signal to be radiated by the antenna element 1020.

The receiver 1030 may additionally comprises analog circuitry. The analog circuitry may comprise various elements such as one or more of a LNA, a filter, a downconverter (mixer), ESD protection circuitry, an attenuator etc. For example, the analog circuitry may be configured to generate an analog input signal based on an RF receive signal received from the antenna element 1020 or another antenna element (not illustrated) of the mobile device 1000.

The mobile device 1000 further comprises a baseband processing circuitry 1011 configured to output digital transmit data 1012. The signal source 1013 may be configured to generate the input signal based on the digital transmit data 1012.

The transmitter 1010 may be configured to generate an RF transmit signal. The transmitter 1010 may use the antenna element 1020 or another antenna element (not illustrated) of the mobile device 1000 for radiating the RF transmit signal to the environment. For example, the transmitter 1010 may be coupled to the antenna element 1020 via one or more intermediate elements such as a filter, an up-converter (mixer) or a PA.

To this end, a mobile device with improved power measurement may be provided allowing the mobile device to achieve increased efficiency.

The mobile device 1000 may comprise further elements such as, e.g., an application processor, baseband processing circuitry, memory, a connectivity module, a Near Field Communication (NFC) controller, an audio driver, a camera driver, a touch screen, a display driver, sensors, removable memory, a power management integrated circuit or a smart battery.

In some examples, the application processor may include, for example, one or more CPU cores and one or more of cache memory, LDO regulators, interrupt controllers, serial interfaces such as SPI, I$^2$C or universal programmable serial interface module, RTC, timer-counters including interval and watchdog timers, general purpose input-output (IO), memory card controllers such as SD/MMC or similar, USB interfaces, MIPI interfaces and JTAG test access ports.

In some examples, the baseband processing circuitry 1011 may be implemented, for example, as a solder-down substrate including one or more integrated circuits, a single packaged integrated circuit soldered to a main circuit board, and/or a multi-chip module containing two or more integrated circuits.

The wireless communication circuits using analog-todigital conversion according to the proposed architecture or one or more of the examples described above may be configured to operate according to one of the 3rd Generation Partnership Project (3GPP)-standardized mobile communication networks or systems. The mobile or wireless communication system may correspond to, for example, a 5$^{th}$ Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/ EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

Figure 11:
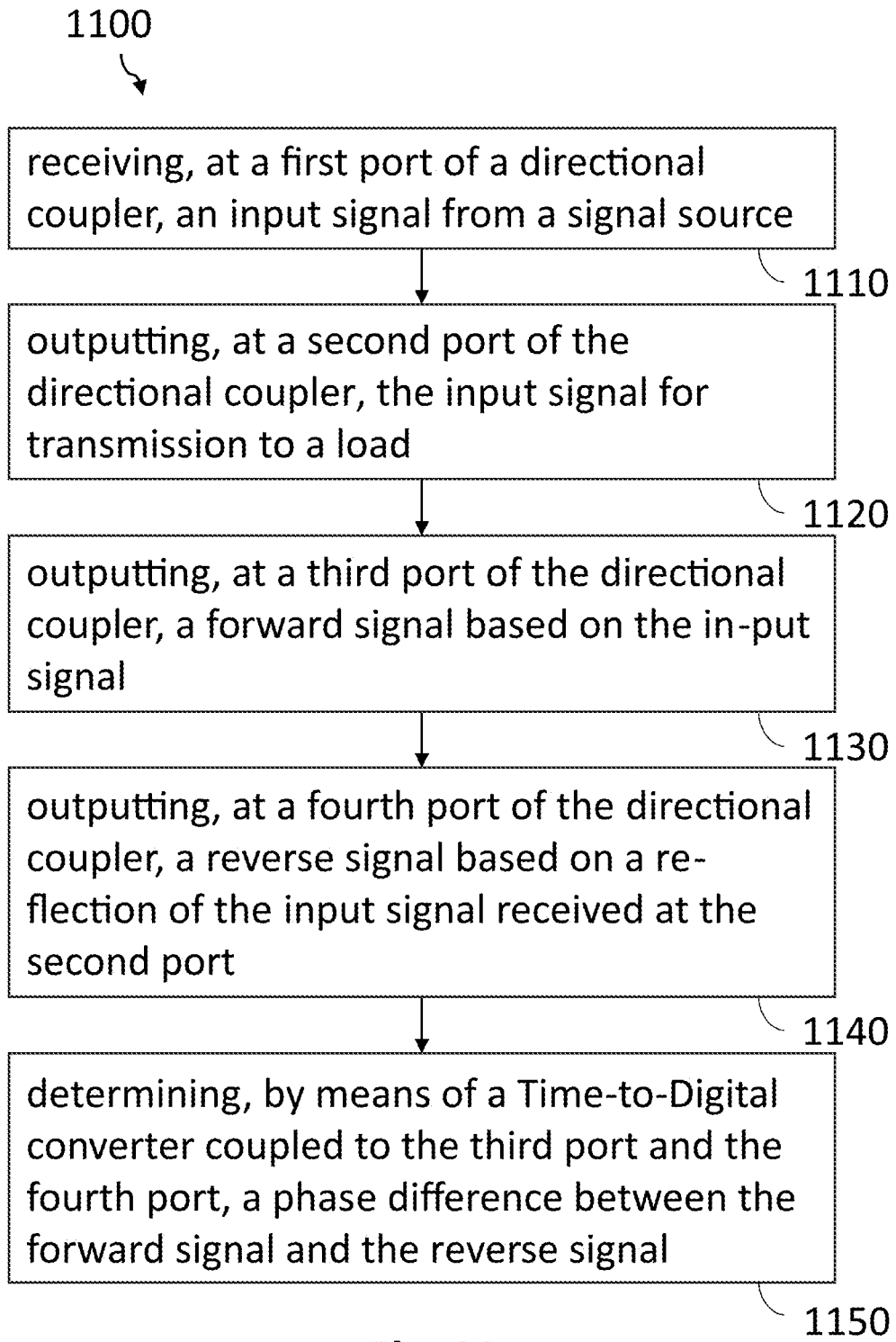
FIG. 11 illustrates an example of a method.

For further illustrating the techniques described herein, FIG. 11 illustrates a flowchart of an example of a method 1100.

The method 1100 comprises receiving 1110, at a first port of a directional coupler, an input signal from a signal source, outputting 1120, at a second port of the directional coupler, the input signal for transmission to a load and outputting 1130, at a third port of the directional coupler, a forward signal based on the input signal. The method 1100 further comprises outputting 1140, at a fourth port of the directional coupler, a reverse signal based on a reflection of the input signal received at the second port and determining 1150, by means of a Time-to-Digital converter, TDC, coupled to the third port and the fourth port, a phase difference between the forward signal and the reverse signal.

In some examples, the method 1100 further comprises determining, by means of a first power detector coupled to the third port, a power of the forward signal and determining, by means of a second power detector coupled to the fourth port, a power of the reverse signal.

In some examples, the method 1100 further comprises determining, by means of a processing circuitry coupled to the TDC, the first power detector and the second power detector, a reflection coefficient of an impedance transition between the second port and the load based on the phase difference, the power of the forward signal and the power of the reverse signal.

In some examples, the method 1100 further comprises outputting, by means of an attenuator coupled between the third port and the TDC, an attenuated forward signal by attenuating the forward signal based on the power of the forward signal and the power of the reverse signal, wherein determining the phase difference is based on the attenuated forward signal.

More details and aspects of the method 1100 are explained in connection with the proposed technique or one or more examples described above (e.g., FIGS. 1a to 1e). The method 1100 may comprise one or more additional optional features corresponding to one or more aspects of the proposed technique, or one or more examples described above.

The method 1100 may enable a measurement of the phase difference, e.g., for reflection coefficient determination. The method 1100 may increase an accuracy of the reflection coefficient determination. The method 1100 may decrease a footprint needed for performing the measurement of the phase difference.

Figure 12:
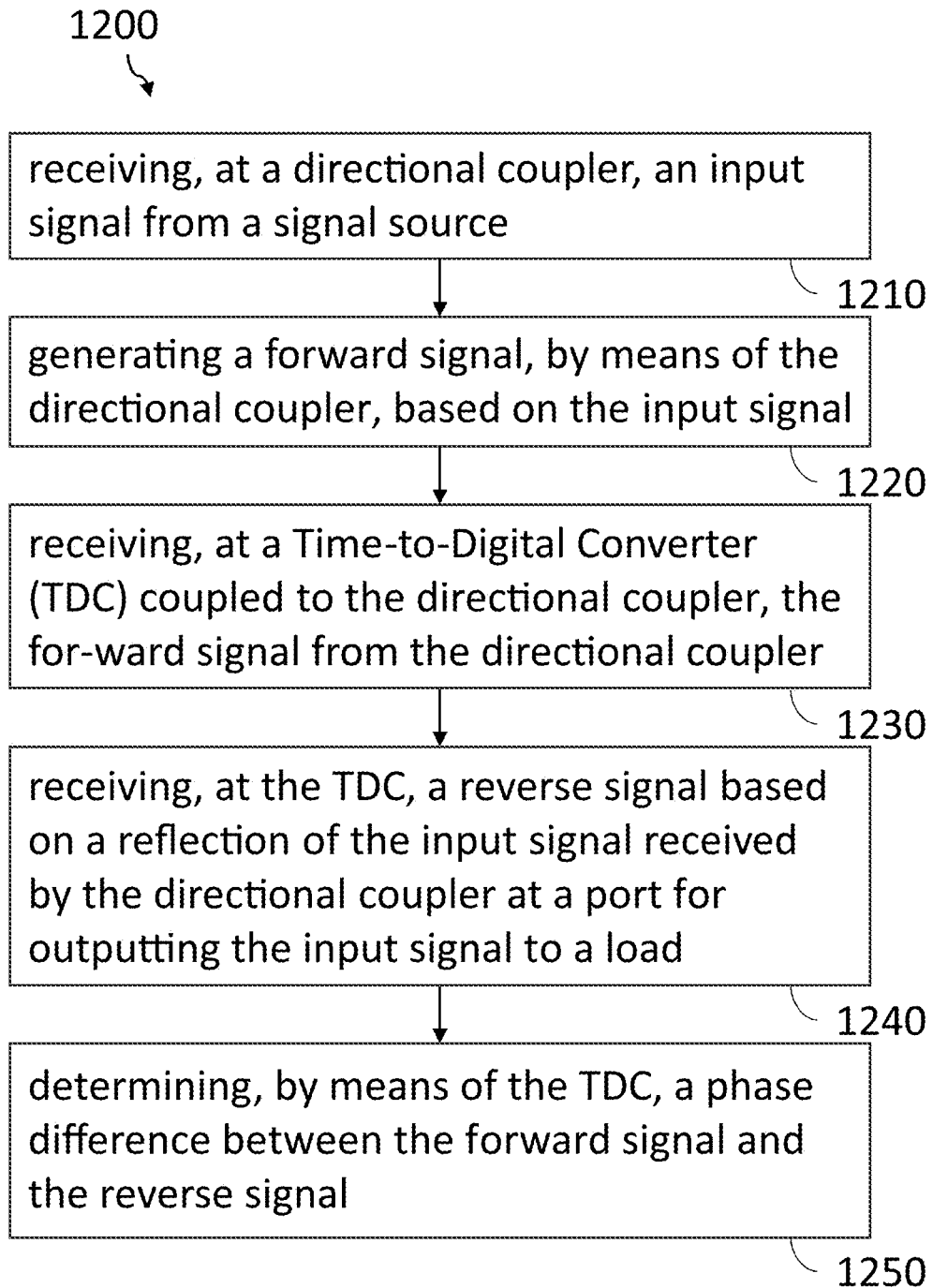
FIG. 12 illustrates another example of a method.

FIG. 12 illustrates another example of a method 1200. The method 1200 comprises receiving 1210, at a directional coupler, an input signal from a signal source and generating 1220 a forward signal, by means of the directional coupler, based on the input signal. The method 1200 further comprises receiving 1230, at a Time-to-Digital Converter, TDC, coupled to the directional coupler, the forward signal from the directional coupler and receiving 1240, at the TDC, a reverse signal based on a reflection of the input signal received by the directional coupler at a port for outputting the input signal to a load. The method 1200 further comprises determining 1250, by means of the TDC, a phase difference between the forward signal and the reverse signal.

In some examples, the method 1200 further comprises determining, by means of a first power detector coupled to the directional coupler, a power of the forward signal and determining, by means of a second power detector coupled to the directional coupler, a power of the reverse signal.

In some examples, the method 1200 further comprises determining, by means of a processing circuitry coupled to the TDC, the first power detector and the second power detector, a reflection coefficient of an impedance transition between the port for outputting the input signal and the load based on the phase difference, the power of the forward signal and the power of the reverse signal.

More details and aspects of the method 1200 are explained in connection with the proposed technique or one or more examples described above (e.g., FIG. 2). The method 1200 may comprise one or more additional optional features corresponding to one or more aspects of the proposed technique, or one or more examples described above.

The method 1200 may enable a measurement of the phase difference, e.g., for reflection coefficient determination. The method 1200 may increase an accuracy of the reflection coefficient determination. The method 1200 may decrease a footprint needed for performing the measurement of the phase difference.

In the following, some examples of the proposed concept are presented:

An example (e.g., example 1) relates to an electronic circuitry comprising a directional coupler comprising a first port configured to receive an input signal from a signal source, a second port configured to output the input signal for transmission to a load, a third port configured to output a forward signal based on the input signal, and a fourth port configured to output a reverse signal based on a reflection of the input signal received at the second port, and a Time-to-Digital converter, TDC, coupled to the third port and the fourth port, wherein the TDC is configured to determine a phase difference between the forward signal and the reverse signal.

Another example (e.g., example 2) relates to a previous example (e.g., example 1) or to any other example, further comprising a first power detector coupled to the third port, wherein the first power detector is configured to determine a power of the forward signal, and a second power detector coupled to the fourth port, wherein the second power detector is configured to determine a power of the reverse signal.

Another example (e.g., example 3) relates to a previous example (e.g., example 2) or to any other example, further comprising processing circuitry coupled to the TDC, the first power detector and the second power detector, wherein the processing circuitry is configured to determine a reflection coefficient of an impedance transition between the second port and the load based on the phase difference, the power of the forward signal and the power of the reverse signal.

Another example (e.g., example 4) relates to a previous example (e.g., example 3) or to any other example, further comprising that the processing circuitry is configured to determine the reflection coefficient by determining an argument of the reflection coefficient based on the phase difference and determining an absolute value of the reflection coefficient based on the power of the forward signal and the power of the reverse signal.

Another example (e.g., example 5) relates to a previous example (e.g., one of the examples 2 to 4) or to any other example, further comprising an attenuator coupled between the third port and the TDC, wherein the attenuator is configured to output an attenuated forward signal by attenuating the forward signal based on the power of the forward signal and the power of the reverse signal, and wherein the TDC is configured to determine the phase difference based on the attenuated forward signal.

Another example (e.g., example 6) relates to a previous example (e.g., example 5) or to any other example, further comprising that the attenuator is configured to attenuate the forward signal such that a difference between an amplitude of the attenuated forward signal and an amplitude of the reverse signal is lower than a difference between an amplitude of the forward signal and the amplitude of the reverse signal.

Another example (e.g., example 7) relates to a previous example (e.g., one of the examples 2 to 4) or to any other example, further comprising a first attenuator coupled between the third port and the TDC, wherein the first attenuator is configured to output an attenuated forward signal by attenuating the forward signal based on the power of the forward signal and the power of the reverse signal, and a second attenuator coupled between the fourth port and the TDC, wherein the second attenuator is configured to output an attenuated reverse signal by attenuating the reverse signal based on the power of the forward signal and the power of the reverse signal, wherein the TDC is configured to determine the phase difference based on the attenuated forward signal and the attenuated reverse signal.

Another example (e.g., example 8) relates to a previous example (e.g., example 7) or to any other example, further comprising that the first attenuator and the second attenuator are configured to attenuate the forward signal and the reverse signal, respectively, such that a difference between an amplitude of the attenuated forward signal and an amplitude of the attenuated reverse signal is lower than a difference between an amplitude of the forward signal and an amplitude of the reverse signal.

Another example (e.g., example 9) relates to a previous example (e.g., one of the examples 1 to 8) or to any other example, further comprising a first inverter coupled between the third port and the TDC, wherein the first invertor is configured to output a first square wave based on the forward signal, and a second inverter coupled between the fourth port and the TDC, wherein the second invertor is configured to output a second square wave based on the reverse signal, and wherein the TDC is configured to determine the phase difference based on the first square wave and the second square wave.

An example (e.g., example 10) relates to an electronic circuitry comprising a directional coupler, and a Time-to-Digital Converter, TDC, coupled to the directional coupler, wherein the TDC is configured to receive, from the directional coupler, a forward signal generated by the directional coupler based on an input signal received by the directional coupler from a signal source, receive, from the directional coupler, a reverse signal based on a reflection of the input signal received by the directional coupler at a port for outputting the input signal to a load, and determine a phase difference between the forward signal and the reverse signal.

Another example (e.g., example 11) relates to a previous example (e.g., example 10) or to any other example, further comprising a first power detector coupled to the directional coupler, wherein the first power detector is configured to determine a power of the forward signal, and a second power detector coupled to the directional coupler, wherein the second power detector is configured to determine a power of the reverse signal.

Another example (e.g., example 12) relates to a previous example (e.g., example 11) or to any other example, further comprising processing circuitry coupled to the TDC, the first power detector and the second power detector, wherein the processing circuitry is configured to determine a reflection coefficient of an impedance transition between the port for outputting the input signal and the load based on the phase difference, the power of the forward signal and the power of the reverse signal.

Another example (e.g., example 13) relates to a previous example (e.g., example 12) or to any other example, further comprising that the processing circuitry is configured to determine the reflection coefficient by determining an argument of the reflection coefficient based on the phase difference and determining an absolute value of the reflection coefficient based on the power of the forward signal and the power of the reverse signal.

Another example (e.g., example 14) relates to a previous example (e.g., one of the examples 11 to 13) or to any other example, further comprising an attenuator coupled between the directional coupler and the TDC, wherein the attenuator is configured to output an attenuated forward signal by attenuating the forward signal based on the power of the forward signal and the power of the reverse signal, and wherein the TDC is configured to determine the phase difference based on the attenuated forward signal.

Another example (e.g., example 15) relates to a previous example (e.g., example 14) or to any other example, further comprising that the attenuator is configured to attenuate the forward signal such that a difference between an amplitude of the attenuated forward signal and an amplitude of the reverse signal is lower than a difference between an amplitude of the forward signal and the amplitude of the reverse signal.

Another example (e.g., example 16) relates to a previous example (e.g., one of the examples 11 to 13) or to any other example, further comprising a first attenuator coupled between the directional coupler and the TDC, wherein the first attenuator is configured to output an attenuated forward signal by attenuating the forward signal based on the power of the forward signal and the power of the reverse signal, and a second attenuator coupled between the directional coupler and the TDC, wherein the second attenuator is configured to output an attenuated reverse signal by attenuating the reverse signal based on the power of the forward signal and the power of the reverse signal, wherein the TDC is configured to determine the phase difference based on the attenuated forward signal and the attenuated reverse signal.

Another example (e.g., example 17) relates to a previous example (e.g., example 16) or to any other example, further comprising that the first attenuator and the second attenuator are configured to attenuate the forward signal and the reverse signal, respectively, such that a difference between an amplitude of the attenuated forward signal and an amplitude of the attenuated reverse signal is lower than a difference between an amplitude of the forward signal and an amplitude of the reverse signal.

Another example (e.g., example 18) relates to a previous example (e.g., one of the examples 1 to 17) or to any other example, further comprising a first inverter coupled between the directional coupler and the TDC, wherein the first invertor is configured to output a first square wave based on the forward signal, and a second inverter coupled between the directional coupler and the TDC, wherein the second invertor is configured to output a second square wave based on the reverse signal, and wherein the TDC is configured to determine the phase difference based on the first square wave and the second square wave.

An example (e.g., example 19) relates to a system comprising an electronic circuitry according to a previous example (e.g., any one of examples 1 to 18) or to any other example, and the signal source, wherein the signal source is configured to generate the input signal.

Another example (e.g., example 20) relates to a previous example (e.g., example 19) or to any other example, further comprising that the signal source comprises a transmitter configured to generate a transmit signal, wherein the input signal is based on the transmit signal.

Another example (e.g., example 21) relates to a previous example (e.g., example 20) or to any other example, further comprising that the signal source further comprises an impedance matching circuit coupled between the transmitter and the directional coupler, wherein the impedance matching circuit is configured to generate the input signal based on the transmit signal.

Another example (e.g., example 22) relates to a previous example (e.g., one of the examples 19 to 21) or to any other example, further comprising that at least part of the input signal is clipped, and wherein the TDC is configured to determine the phase difference based on a part of the forward signal which is based on the clipped part of the input signal.

Another example (e.g., example 23) relates to a previous example (e.g., one of the examples 19 to 21) or to any other example, further comprising that the input signal comprises a preamble part and a payload part, wherein at least part of the payload part is clipped, and wherein the TDC is configured to determine the phase difference based on a part of the forward signal which is based on the clipped part of the payload part.

Another example (e.g., example 24) relates to a previous example (e.g., one of the examples 19 to 23) or to any other example, further comprising a semiconductor die, wherein the electronic circuitry and the signal source are integrated into the semiconductor die.

Another example (e.g., example 25) relates to a previous example (e.g., one of the examples 19 to 24) or to any other example, further comprising the load.

Another example (e.g., example 26) relates to a previous example (e.g., example 25) or to any other example, further comprising that the load comprises at least one antenna configured to radiate a radio frequency transmit signal based on the input signal.

Another example (e.g., example 27) relates to a previous example (e.g., example 26) or to any other example, further comprising that the load comprises at least one radio frequency frontend coupled between the antenna and the directional coupler, wherein the frontend is configured to output a radio frequency antenna signal based on filtering and/or duplexing of the input signal, and wherein the antenna is configured to radiate the radio frequency transmit signal based on the radio frequency antenna signal.

An example (e.g., example 28) relates to a base station comprising a system according to a previous example (e.g., any one of examples 19 to 27) or to any other example, and a receiver configured to receive a radio frequency receive signal.

Another example (e.g., example 29) relates to a previous example (e.g., example 28) or to any other example, further comprising at least one antenna coupled to the receiver.

Another example (e.g., example 30) relates to a previous example (e.g., one of the examples 28 or 29) or to any other example, further comprising a baseband processing circuitry configured to output digital transmit data, wherein the signal source is configured to generate the input signal based on the digital transmit data.

An example (e.g., example 31) relates to a mobile device comprising a system according to a previous example (e.g., any one of examples 19 to 27) or to any other example, and a receiver configured to generate a radio frequency transmit signal.

Another example (e.g., example 32) relates to a previous example (e.g., example 31) or to any other example, further comprising at least one antenna coupled to the receiver.

An example (e.g., example 33) relates to a method comprising receiving, at a first port of a directional coupler, an input signal from a signal source, outputting, at a second port of the directional coupler, the input signal for transmission to a load, outputting, at a third port of the directional coupler, a forward signal based on the input signal, outputting, at a fourth port of the directional coupler, a reverse signal based on a reflection of the input signal received at the second port, and determining, by means of a Time-to-Digital converter, TDC, coupled to the third port and the fourth port, a phase difference between the forward signal and the reverse signal.

Another example (e.g., example 34) relates to a previous example (e.g., example 33) or to any other example, further comprising determining, by means of a first power detector coupled to the third port, a power of the forward signal, and determining, by means of a second power detector coupled to the fourth port, a power of the reverse signal.

Another example (e.g., example 35) relates to a previous example (e.g., example 34) or to any other example, further comprising determining, by means of a processing circuitry coupled to the TDC, the first power detector and the second power detector, a reflection coefficient of an impedance transition between the second port and the load based on the phase difference, the power of the forward signal and the power of the reverse signal.

Another example (e.g., example 36) relates to a previous example (e.g., one of the examples 34 or 35) or to any other example, further comprising outputting, by means of an attenuator coupled between the third port and the TDC, an attenuated forward signal by attenuating the forward signal based on the power of the forward signal and the power of the reverse signal, wherein determining the phase difference is based on the attenuated forward signal.

An example (e.g., example 37) relates to a method comprising receiving, at a directional coupler, an input signal from a signal source, generating a forward signal, by means of the directional coupler, based on the input signal, receiving, at a Time-to-Digital Converter, TDC, coupled to the directional coupler, the forward signal from the directional coupler, receiving, at the TDC, a reverse signal based on a reflection of the input signal received by the directional coupler at a port for outputting the input signal to a load, and determining, by means of the TDC, a phase difference between the forward signal and the reverse signal.

Another example (e.g., example 38) relates to a previous example (e.g., example 37) or to any other example, further comprising determining, by means of a first power detector coupled to the directional coupler, a power of the forward signal, and determining, by means of a second power detector coupled to the directional coupler, a power of the reverse signal.

Another example (e.g., example 39) relates to a previous example (e.g., example 38) or to any other example, further comprising determining, by means of a processing circuitry coupled to the TDC, the first power detector and the second power detector, a reflection coefficient of an impedance transition between the port for outputting the input signal and the load based on the phase difference, the power of the forward signal and the power of the reverse signal.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor, or other programmable hardware component. Thus, steps, operations, or processes of different ones of the methods described above may also be executed by programmed computers, processors, or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example.

It is further understood that the disclosure of several steps, processes, operations, or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process, or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. An electronic circuitry comprising:
a directional coupler comprising:
a first port configured to receive an input signal from a signal source;
a second port configured to output the input signal for transmission to a load;
a third port configured to output a forward signal based on the input signal; and
a fourth port configured to output a reverse signal based on a reflection of the input signal received at the second port;
an attenuator coupled between the third port and a Time-to-Digital converter, TDC,
wherein the attenuator is configured to output an attenuated forward signal by attenuating the forward signal based on a power of the forward signal and a power of the reverse signal; and
the TDC, coupled to the third port and the fourth port,
wherein the TDC is configured to determine a phase difference between the forward signal and the reverse signal based on the attenuated forward signal.

2. The electronic circuitry of claim 1, further comprising:
a first power detector coupled to the third port, wherein the first power detector is configured to determine the power of the forward signal; and
a second power detector coupled to the fourth port, wherein the second power detector is configured to determine the power of the reverse signal.

3. The electronic circuitry of claim 2, further comprising processing circuitry coupled to the TDC, the first power detector and the second power detector, wherein the processing circuitry is configured to determine a reflection coefficient of an impedance transition between the second port and the load based on the phase difference, the power of the forward signal and the power of the reverse signal.

4. The electronic circuitry of claim 3, wherein the processing circuitry is configured to determine the reflection coefficient by determining an argument of the reflection coefficient based on the phase difference and determining an absolute value of the reflection coefficient based on the power of the forward signal and the power of the reverse signal.

5. The electronic circuitry of claim 1, wherein the attenuator is configured to attenuate the forward signal such that a difference between an amplitude of the attenuated forward signal and an amplitude of the reverse signal is lower than a difference between an amplitude of the forward signal and the amplitude of the reverse signal.

6. The electronic circuitry of claim 1, further comprising:
a second attenuator coupled between the fourth port and the TDC, wherein the second attenuator is configured to output an attenuated reverse signal by attenuating the reverse signal based on the power of the forward signal and the power of the reverse signal,
wherein the TDC is configured to determine the phase difference based on the attenuated forward signal and the attenuated reverse signal.

7. The electronic circuitry of claim 6, wherein the attenuator and the second attenuator are configured to attenuate the forward signal and the reverse signal, respectively, such that a difference between an amplitude of the attenuated forward signal and an amplitude of the attenuated reverse signal is lower than a difference between an amplitude of the forward signal and an amplitude of the reverse signal.

8. The electronic circuitry of claim 1, further comprising:
a first inverter coupled between the third port and the TDC, wherein the first inverter is configured to output a first square wave based on the forward signal; and
a second inverter coupled between the fourth port and the TDC, wherein the second inverter is configured to output a second square wave based on the reverse signal, and wherein the TDC is configured to determine the phase difference based on the first square wave and the second square wave.

9. A system comprising:
a signal source, wherein the signal source is configured to generate an input signal
an electronic circuitry comprising:
a directional coupler comprising:
a first port configured to receive the input signal from the signal source;
a second port configured to output the input signal for transmission to a load;
a third port configured to output a forward signal based on the input signal;
and
a fourth port configured to output a reverse signal based on a reflection of the input signal received at the second port; and
a Time-to-Digital converter,-TDC, coupled to the third port and the fourth port, wherein at least part of the input signal is clipped, and wherein the TDC is configured to determine a phase difference between the forward signal and the reverse signal based on a part of the forward signal that is based on the clipped part of the input signal.

10. The system of claim 9, wherein the signal source comprises a transmitter configured to generate a transmit signal, wherein the input signal is based on the transmit signal.

11. The system of claim 10, wherein the signal source further comprises an impedance matching circuit coupled between the transmitter and the directional coupler,
wherein the impedance matching circuit is configured to generate the input signal based on the transmit signal.

12. A base station comprising:
a system according to claim 9; and
a receiver configured to receive a radio frequency receive signal.

13. The base station of claim 12, further comprising at least one antenna coupled to the receiver.

14. The base station of claim 12, further comprising a baseband processing circuitry configured to output digital transmit data, wherein the signal source is configured to generate the input signal based on the digital transmit data.

15. A method comprising:
receiving, at a directional coupler, an input signal from a signal source;
generating a forward signal, by means of the directional coupler, based on the input signal;
receiving, at a Time-to-Digital Converter, TDC, coupled to the directional coupler, the forward signal from the directional coupler;
receiving, at the TDC, a reverse signal based on a reflection of the input signal received by the directional coupler at a port for outputting the input signal to a load;
outputting, by means of an attenuator coupled to the TDC, an attenuated forward signal by attenuating the forward signal based on a power of the forward signal and a power of the reverse signal; and
determining, by means of the TDC, a phase difference between the forward signal and the reverse signal based on the attenuated forward signal.

16. The method of claim 15, further comprising:
determining, by means of a first power detector coupled to the directional coupler, the power of the forward signal; and
determining, by means of a second power detector coupled to the directional coupler, the power of the reverse signal.

17. The method of claim 16, further comprising determining, by means of a processing circuitry coupled to the TDC, the first power detector and the second power detector, a reflection coefficient of an impedance transition between the port for outputting the input signal and the load based on the phase difference, the power of the forward signal and the power of the reverse signal.

* * * * *